United States Patent
Arai et al.

(10) Patent No.: US 7,368,759 B2
(45) Date of Patent: May 6, 2008

(54) SEMICONDUCTOR LIGHT-EMITTING DEVICE

(75) Inventors: Masahiro Arai, Tsuchiura (JP);
Taichiroo Konno, Tsuchiura (JP);
Kazuyuki Iizuka, Tsuchiura (JP);
Katsuya Akimoto, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 113 days.

(21) Appl. No.: 11/485,420

(22) Filed: Jul. 13, 2006

(65) Prior Publication Data

US 2007/0075327 A1    Apr. 5, 2007

(30) Foreign Application Priority Data

Sep. 30, 2005  (JP) .............................. 2005-285921
Sep. 30, 2005  (JP) .............................. 2005-285931

(51) Int. Cl.
*H01L 33/00* (2006.01)

(52) U.S. Cl. ...................... 257/103; 257/101; 257/102; 257/E33.043

(58) Field of Classification Search ................ 257/103, 257/E33.043
See application file for complete search history.

(56) References Cited

U.S. PATENT DOCUMENTS

RE35,665 E    11/1997  Lin et al.
6,057,562 A    5/2000  Lee et al.
2006/0001042 A1*  1/2006  Suzuki et al. ............... 257/103

FOREIGN PATENT DOCUMENTS

JP    8-83927 A    3/1996

* cited by examiner

*Primary Examiner*—Tu-Tu Ho
(74) *Attorney, Agent, or Firm*—Foley & Lardner LLP

(57) ABSTRACT

A semiconductor light emitting device has a light-emitting portion formed on a semiconductor substrate, an As-based p-type contact layer formed thereon, a current spreading layer formed thereon of a metal oxide material, and a buffer layer formed between the p-type cladding layer and the p-type contact layer. The buffer layer has a group III/V semiconductor with a p-type conductivity and hydrogen or carbon included intentionally or unavoidably therein, and the buffer layer has a thickness equal to or greater than a diffusion length L of a dopant doped into the p-type contact layer.

34 Claims, 10 Drawing Sheets

※thickness t: t>Zn diffusion length (UNIT: μm)

SEMICONDUCTOR LIGHT-EMITTING DEVICE

The present application is based on Japanese patent application Nos.2005-285921 and 2005-285931, the entire contents of which are incorporated herein by reference.

BACKGROUND OF THE INVENTION

1. Field of the Invention

This invention relates to a semiconductor light emitting device and, in particular, to a high-brightness semiconductor light emitting device with a transparent conductive film to serve as a current spreading layer.

2. Description of the Related Art

In recent years, the crystalline quality of GaN-based or AlGaInP-based semiconductors is improved since they can be grown by a MOVPE (metalorganic vapor phase epitaxy) method. Thus, a high-brightness blue, green, orange, yellow, and red light-emitting diode (herein referred to as LED) as a semiconductor light emitting device can be fabricated.

However, in order to achieve the high brightness, the current spreading property needs to be improved such that current is uniformly supplied into a chip plane of an LED. For example, an AlGaInP-based LED device is fabricated such that the current spreading layer has a thickness increased to about 5 to 10 μm. Therefore, the growth of the thick current spreading layer causes an increase in the fabrication cost of the LED device. Thus, the LED device is difficult to fabricate at low cost.

In consideration of this, a method is proposed that an ITO (indium tin oxide) or ZnO (zinc oxide) film is used as the current spreading layer to get a sufficient translucency and good current spreading characteristics (JP-A-8-83927). Further, a method is proposed that an ITO film is directly formed on a p-type cladding layer (U.S. Reissued Pat. No.35665).

When the ITO film is used as the current spreading layer, the conventional method of increasing the thickness of the semiconductor layer as the current spreading layer to about 5 to 10 μm is not necessary, and the formation of the epitaxial layer can be saved by that much. Thus, the high-brightness LED device and the epitaxial wafer for the LED device can be fabricated at low cost.

However, when the ITO film is used as a window layer, a contact resistance is generated between the semiconductor layer and the ITO film of a metal oxide, and a forward voltage disadvantageously increases. More specifically, the ITO film used as a transparent conductive film (transparent electrode) is an n-type semiconductor. On the other hand, the upper cladding layer contacting the ITO film is a p-type semiconductor. Therefore, when a forward voltage is applied to the LED, a reverse bias is established between the transparent conductive film (transparent electrode) and the p-type cladding layer. Because of this, a large voltage (i.e., increased operating voltage) has to be applied to flow current therethrough.

To solve this problem, a method is proposed that a high carrier concentration layer (=contact layer) is formed to contact the ITO film to offer a tunnel junction which allows the LED to be driven at a low voltage (e.g., Reissue Pat. No. 35665).

However, the contact layer needs to be formed as a high carrier concentration layer and a thin film since it has to offer the tunnel junction and can be a light-absorbing layer to light emitted from the active layer. Therefore, the dopant diffusion is likely to occur due to heat generated during the growth. As a result, the following two problems will be caused.

First, the dopant is diffused from the contact layer to the depth direction of the LED device. When the dopant reaches the active layer of the LED device, the dopant causes a defect in the active layer. The defect will work as a nonradiative recombination component to lower the optical output of the LED device.

Second, since a substantial carrier concentration of the high-carrier concentration contact layer lowers due to the dopant diffusion, the tunnel junction is difficult to obtain and the tunnel voltage is increased. For this reason, the drive voltage (forward voltage) of the LED device disadvantageously increases.

Zn is widely used as a p-type dopant for AlGaInP-based or AlGaAs-based compound semiconductors, but it is known that its diffusion constant is relatively large and it causes an adverse effect during heat process. Therefore, when Zn is doped into the p-type cladding layer to increase a carrier concentration thereof, the Zn is diffused into the active layer so that the characteristics of the LED device are deteriorated.

Further, when Mg, which has a smaller diffusion constant than Zn, is used as a p-type dopant of the p-type cladding layer to increase a carrier concentration thereof, and Zn, which can relatively easy offer a carrier concentration of $1\times10^{19}/cm^3$ and a sufficiently small contact resistivity, is used as a p-type dopant of the p-type contact layer, the diffusion of the p-type dopants, Zn and Mg causes a significant adverse effect since they are likely to be inter-diffused.

Meanwhile, there are three ways of doping the dopants, i.e., Mg only, Zn only and a combination of Zn and Mg. The amount of diffusion is increased in this order. Namely, the magnitude relation in diffusion amount is (Mg only)<(Zn only)<(a combination of Zn and Mg). Thus, in order to suppress the interdiffusion, only Zn or Mg is desirably doped. However, to dope only Zn or Mg causes the next advantages and disadvantages.

In case of doping Mg only, it is difficult to provide the contact layer with a high carrier concentration. For example, it is very difficult to offer the tunnel junction relative to the ITO film. On the other hand, the Mg diffusion from the p-type cladding layer to the active layer is very low so that an LED device with a long lifetime can be stably obtained.

In case of doping Zn only, in contrast to the case of doping Mg only, the tunnel junction relative to the ITO film can be relatively easy obtained. Namely, it is relatively easy to increase the carrier concentration of the contact layer. On the other hand, since the Zn diffusion from the p-cladding layer to the active layer is likely to occur, the lifetime of LED device becomes short as compared to the case of doping Mg only. Further, in case of doping Zn, it is difficult to obtain a high carrier concentration crystal for AlGaInP-based material as compared to Mg. Thus, a range of Zn carrier concentration to be set is limited and therefore it is difficult to obtain a high-brightness LED device.

In case of doping a combination of Zn and Mg, an LED device can be obtained suitably to some extent by using the following composition. First, Zn is used as a dopant for the contact layer to get the tunnel junction relative to the ITO film. Then, Mg is used as a dopant for a p-type semiconductor layer other than the contact layer, e.g., buffer layer and p-type cladding layer, to have the high-carrier concentration p-type semiconductor layer to offer a high-brightness LED device.

However, the combination of Zn and Mg causes the interdiffusion of Zn and Mg as described earlier. Therefore, in this case, it is necessary to suppress the degradation of the device lifetime.

On the other hand, when the contact layer is formed directly on the p-type cladding layer without forming the buffer layer and the ITO film is formed thereon (U.S. Reissued Pat. No.35665), the dopant is likely to reach the active layer due to the thin p-type cladding layer, whereby the device lifetime will be shortened. Further, due to the thin p-type cladding layer, the device is likely to be broken by damage in wire bonding.

SUMMARY OF THE INVENTION

It is an object of the invention to provide a semiconductor light emitting device that can achieve a high brightness and low operating voltage while preventing a reduction in optical output and an increase in operating voltage with time.

(1) According to one aspect of the invention, a semiconductor light emitting device comprises:

a light-emitting portion formed on a semiconductor substrate, the light-emitting portion comprising an n-type cladding layer, an active layer and a p-type cladding layer;

an As-based p-type contact layer formed on the light-emitting portion, a carrier concentration of the p-type contact layer comprising $1 \times 10^{19}/cm^3$ or more and a dopant material of the p-type contract layer being different from that of the p-type cladding layer;

a current spreading layer formed on the p-type contact layer, the current spreading layer comprising a metal oxide material; and a buffer layer formed between the p-type cladding layer and the p-type contact layer, wherein the buffer layer comprises a group III/V semiconductor with a p-type conductivity and hydrogen included intentionally or unavoidably therein, and the buffer layer comprises a thickness equal to or greater than a diffusion length L of a dopant doped into the p-type contact layer.

Herein, to include "intentionally" means to dope positively or purposely. To include "unavoidably" means an unavoidable phenomenon that an impurity such as H (hydrogen) and C (carbon) is naturally mixed into a crystal although it is not doped positively, purposely or intentionally. Further, herein "undoped", "non-doped" or "not doped" means that a dopant is not doped positively, intentionally or purposely, and it does not exclude a phenomenon that an impurity such as H (hydrogen) and C (carbon) is unavoidably mixed in a crystal.

In the above invention (1), the following modifications and changes can be made.

(i) The p-type cladding layer contains Mg as the dopant, the p-type contact layer contains Zn as the dopant, and the diffusion length L is represented by: L [μm]=$6.869 \times 10^{-15} \times N_H^{0.788}$, where $N_H$ is a hydrogen concentration [$cm^{-3}$] of the buffer layer.

(ii) The p-type contact layer comprises $Al_xGa_{1-x}As$, where $0 \leq x \leq 0.4$.

Semiconductor materials capable of providing stably the contact layer with a high carrier concentration of $1.0 \times 10^{19}/cm^3$ or more are limited. Of them, an optimal semiconductor material is a Zn-doped $Al_xGa_{1-x}As$, where $0 \leq x \leq 0.4$. However, since the AlGaAs is not transparent to the emission wavelength, it needs to be formed with a thickness of about 30 nm or less.

(iii) The buffer layer comprises $Al_xGa_{1-x}As$, where $0.4 \leq x \leq 1$.

(iv) The current-spreading layer comprises at least one of ITO (indium tin oxide), $SnO_2$ (tin oxide), ATO (antimony tin oxide), $In_2O_3$ (indium oxide), ZnO (zinc oxide), GZO (gallium zinc oxide), BZO (boron zinc oxide), AZO (aluminum zinc oxide), CdO (cadmium oxide), CTO (cadmium tin oxide), IZO (indium zinc oxide).

(v) The current-spreading layer comprises a thickness of within ±30% of d calculated by: $d = A \times \lambda_p/(4 \times n)$, where A is a constant (A=1 or 3), $\lambda_p$ is an emission wavelength (nm) of the light emitting device, and n is a refractive index of the current-spreading layer.

(vi) The light-emitting portion comprises $(Al_xGa_{1-x})_yIn_{1-y}P$, where $0 \leq x \leq 1$ and $0.4 \leq y \leq 0.6$, and the p-type cladding layer and the n-type cladding layer comprise a higher Al composition than the active layer.

(vii) The current-spreading layer comprises a carrier concentration of $7 \times 10^{20}/cm^3$ or more.

(viii) The p-type contact layer comprises a thickness of 1 nm or more and 30 nm or less.

(ix) The semiconductor light emitting device further comprises:

a light reflecting layer formed between the substrate and the n-type cladding layer, wherein the light reflecting layer comprises 10 pairs or more and 30 pairs or less of semiconductor layers, each pair comprising a combination of a high-refractive index material layer and a low-refractive index material layer.

(x) The light reflecting layer comprises at least one of $(Al_xGa_{1-x})As$ where $0.4 \leq x \leq 1$, and $(Al_xGa_{1-x})_yIn_{1-y}P$ where $0 \leq x \leq 1$ and $0.4 \leq y \leq 0.6$.

(xi) The active layer comprises a light emitting layer and a barrier layer with a bandgap wider than the light emitting layer.

(xii) The active layer comprises a quantum well structure that the light emitting layer comprises a thickness of 9 nm or less, or a strained quantum well structure that the light emitting layer comprises a crystal lattice constant different from that of the n-type cladding layer or the p-type cladding layer.

(xiii) The p-type cladding layer comprises at least a portion with a Mg concentration of $1 \times 10^{17}/cm^3$ or more and $5 \times 10^{18}/cm^3$ or less.

If the Mg concentration is less than $1 \times 10^{17}/cm^3$, the carrier concentration of the p-type cladding layer is too low to get its sufficient effect as a carrier supply layer. If the Mg is doped more than $5 \times 10^{18}/cm^3$, crystal defects will arise in the p-type cladding layer nearly according to the Mg concentration so that the diffusion of the dopant causes a reduction of the internal quantum efficiency of the LED, thus the optical output in the LED device lowers.

(xiv) The substrate comprises a semiconductor material of GaAs, Ge or Si, or a metallic material with a thermal conductivity greater than Si.

(xv) The semiconductor light emitting device further comprises:

a diffusion-suppressing layer formed between the active layer and the p-type cladding layer, wherein the diffusion-suppressing layer comprises any one or a combination of: an undoped semiconductor layer, a semiconductor layer with a lower dopant concentration than the p-type cladding layer, and a semiconductor layer doped with an n-type dopant and a p-type dopant together to be neutral in pseudo conduction type, and the diffusion-suppressing layer comprises a thickness of 300 nm or less.

(xvi) The semiconductor light emitting device further comprises:

a diffusion-suppressing layer formed between the active layer and the n-type cladding layer, wherein the diffusion-suppressing layer comprises any one or a combination of: an undoped semiconductor layer, a semiconductor layer with a lower dopant concentration than the n-type cladding layer, and a semiconductor layer doped with an n-type dopant and a p-type dopant together to be neutral in pseudo conduction type, and the diffusion-suppressing layer comprises a thickness of 200 nm or less.

(2) According to another aspect of the invention, a semiconductor light emitting device comprises:

a light-emitting portion formed on a semiconductor substrate, the light-emitting portion comprising an n-type cladding layer, an active layer and a p-type cladding layer;

an As-based p-type contact layer formed on the light-emitting portion, a concentration of the p-type contact layer comprising $1 \times 10^{19}/cm^3$ or more and the dopant material of p-type contact layer being different from that of the p-type cladding layer;

a current spreading layer formed on the p-type contact layer, the current spreading layer comprising a metal oxide material; and a buffer layer formed between the p-type cladding layer and the p-type contact layer, wherein the buffer layer comprises a group III/V semiconductor with a p-type conductivity and carbon included intentionally or unavoidably therein, and the buffer layer comprises a thickness equal to or greater than a diffusion length L of a dopant doped into the p-type contact layer.

In the above invention (2), the following modifications and changes can be made.

(xvii) The p-type cladding layer contains Mg as the dopant, the p-type contact layer contains Zn as the dopant, and the diffusion length L is represented by: L [µm]=$6.872 \times 10^{-14} \times N_C^{0.733}$, where $N_C$ is a carbon concentration [$cm^{-3}$] of the buffer layer.

(xviii) The p-type contact layer comprises $Al_xGa_{1-x}As$, where $0 \leq x \leq 0.4$.

Semiconductor materials capable of providing stably the contact layer with a high carrier concentration of $1.0 \times 10^{19}/cm^3$ or more are limited. Of them, an optimal semiconductor material is a Zn-doped $Al_xGa_{1-x}As$, where $0 \leq x \leq 0.4$. However, since the AlGaAs is not transparent to the emission wavelength, it needs to be formed with a thickness of about 30 nm or less.

(xix) The buffer layer comprises $Al_xGa_{1-x}As$, where $0.4 \leq x \leq 1$.

(xx) The current-spreading layer comprises at least one of ITO (indium tin oxide), $SnO_2$ (tin oxide), ATO (antimony tin oxide), $In_2O_3$ (indium oxide), ZnO (zinc oxide), GZO (gallium zinc oxide), BZO (boron zinc oxide), AZO (aluminum zinc oxide), CdO (cadmium oxide), CTO (cadmium tin oxide), IZO (indium zinc oxide).

(xxi) The current-spreading layer comprises a thickness of within ±30% of d calculated by: $d'=A \times \lambda_p/(4 \times n)$, where A is a constant (A=1 or 3), $\lambda_p$ is an emission wavelength (nm) of the light emitting device, and n is a refractive index of the current-spreading layer.

(xxii) The light-emitting portion comprises $(Al_xGa_{1-x})_yIn_{1-y}P$, where $0 \leq x \leq 1$ and $0.4 \leq y \leq 0.6$, and the p-type cladding layer and the n-type cladding layer comprise a higher Al composition than the active layer.

(xxiii) The current-spreading layer comprises a carrier concentration of $7 \times 10^{20}/cm^3$ or more.

(xxiv) The p-type contact layer comprises a thickness of 1 nm or more and 30 nm or less.

(xxv) The semiconductor light emitting device further comprises:

a light reflecting layer formed between the substrate and the n-type cladding layer, wherein the light reflecting layer comprises 10 pairs or more and 30 pairs or less of semiconductor layers, each pair comprising a combination of a high-refractive index material layer and a low-refractive index material layer.

(xxvi) The light reflecting layer comprises combinations of at least one of $(Al_xGa_{1-x})As$ where $0.4 \leq x \leq 1$, and $(Al_xGa_{1-x})_yIn_{1-y}P$ where $0 \leq x \leq 1$ and $0.4 \leq y \leq 0.6$.

(xxvii) The active layer comprises a light emitting layer and a barrier layer with a bandgap wider than the light emitting layer.

(xxviii) The active layer comprises a quantum well structure that the light emitting layer comprises a thickness of 9 nm or less, or a strained quantum well structure that the light emitting layer comprises a crystal lattice constant different from that of the n-type cladding layer or the p-type cladding layer.

(xxix) The p-type cladding layer comprises at least a portion with a Mg concentration of $1 \times 10^{17}/cm^3$ or more and $5 \times 10^{18}/cm^3$ or less.

If the Mg concentration is less than $1 \times 10^{17}/cm^3$, the carrier concentration of the p-type cladding layer is too low to get its sufficient effect as a carrier supply layer. If the Mg is doped more than $5 \times 10^{18}/cm^3$, crystal defects will arise in the p-type cladding layer nearly according to the Mg concentration so that the diffusion of the dopant causes a reduction of the internal quantum efficiency of the LED, thus the optical output of the LED device lowers.

(xxx) The substrate comprises a semiconductor material of GaAs, Ge or Si, or a metallic material with a thermal conductivity greater than Si.

(xxxi) The semiconductor light emitting device further comprises:

a diffusion-suppressing layer formed between the active layer and the p-type cladding layer, wherein the diffusion-suppressing layer comprises any one or a combination of: an undoped semiconductor layer, a semiconductor layer with a lower dopant concentration than the p-type cladding layer, and a semiconductor layer doped with an n-type dopant and a p-type dopant together to be neutral in pseudo conduction type, and the diffusion-suppressing layer comprises a thickness of 300 nm or less.

(xxxii) The semiconductor light emitting device further comprises:

a diffusion-suppressing layer formed between the active layer and the n-type cladding layer, wherein the diffusion-suppressing layer comprises any one or a combination of: an undoped semiconductor layer, a semiconductor layer with a lower dopant concentration than the n-type cladding layer, and a semiconductor layer doped with an n-type dopant and a p-type dopant together to be neutral in pseudo conduction type, and the diffusion-suppressing layer comprises a thickness of 200 nm or less.

ADVANTAGES OF THE INVENTION

In the invention, the diffusion length of Zn can be set by a concentration value of H which is included intentionally or unavoidably in the buffer layer. Thus, the Zn diffusion length can be set so that it falls within the thickness of the buffer layer.

In the invention, by suppressing effectively the interdiffusion of dopants from the p-type contact layer and the other p-type semiconductor layer, a semiconductor light emitting device can be provided to achieve a high brightness a low operating voltage and a good reliability by suppressing a reduction in optical output and an increase in operating voltage with time.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
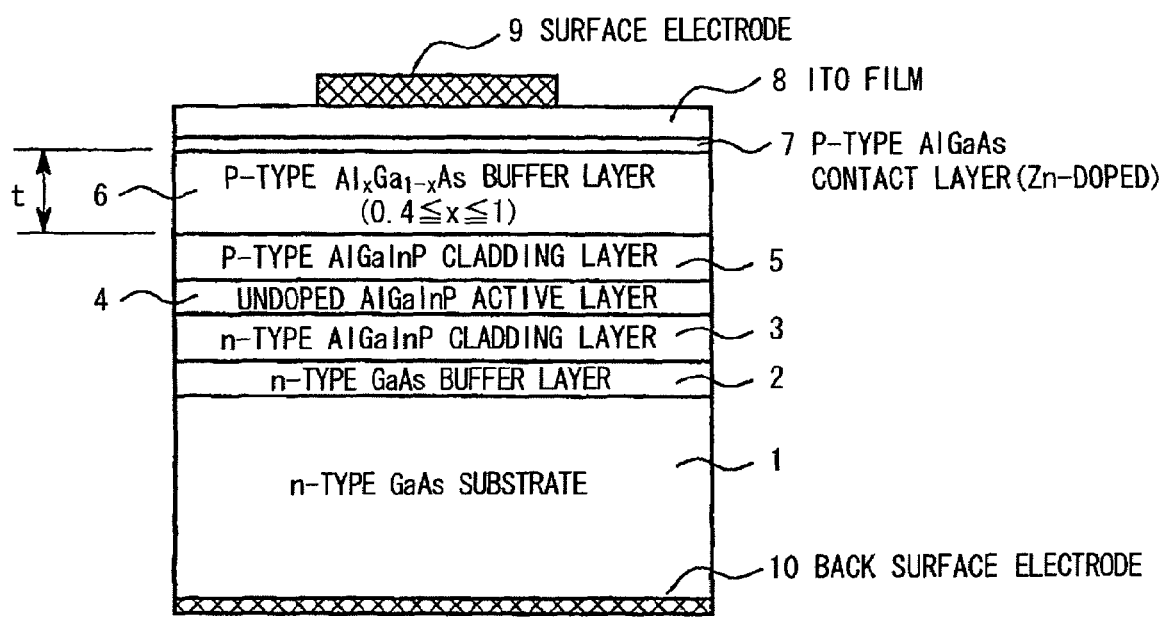
FIG. 1 is a schematic cross sectional view showing an AlGaInP-based red LED in first and second preferred embodiments of the invention and Examples 1 and 5 of the invention.

FIG. 1 is a cross sectional view showing an AlGaInP-based red LED in the first preferred embodiment of the invention.

The LED comprises, sequentially formed on an n-type GaAs substrate 1 as a semiconductor substrate, an n-type GaAs buffer layer 2, an n-type AlGaInP cladding layer 3 (herein also simply called n-type cladding layer), an undoped AlGaInP active layer 4 (herein also simply called active layer) and a p-type AlGaInP cladding layer 5 (herein also simply called p-type cladding layer 5), where the layers 3-5 are epitaxially grown to compose a light-emitting portion. Further, a p-type (As-based) AlGaAs contact layer 7 (herein also simply called p-type contact layer 7) doped with a p-type dopant at a high concentration is formed on the p-type cladding layer 5. Further, an ITO film (current-spreading layer) 8, which is a current-spreading layer made of a metal oxide and a transparent conductive film, is formed on the p-type contact layer 7. A surface electrode 9 is formed on the surface of the ITO film 8, and a back surface electrode 10 is formed on the back surface of the n-type GaAs substrate 1.

The p-type contact layer 7 is made of $Al_xGa_{1-x}As$ (wherein $0 \leq x \leq 0.4$), and has a thickness of 1 nm or more and 30 nm or less. Zn as a p-type dopant is doped at a high carrier concentration of $1 \times 10^{19}/cm^3$ or more.

The film thickness of the ITO film 8 as the current spreading layer is in a range of ±30% of d calculated by a relational expression of $d = A \times \lambda_p/(4 \times n)$, where A is a constant (A=1 or 3), $\lambda_p$ is an emission wavelength (nm) of the LED, and n is a refractive index of the ITO film. The ITO film 8 as the current spreading layer is formed by a vacuum deposition method or a sputtering method. The ITO film 8 has preferably a carrier concentration of $7 \times 10^{20}/cm^3$ or more just after the film formation.

A feature of the LED is that a p-type buffer layer 6 is formed between the p-type contact layer 7 and the p-type cladding layer 5, and it comprises a group III/V semiconductor doped with the Mg as a p-dopant.

The p-type buffer layer 6 is formed of an $Al_xGa_{1-x}As$ ($0.4 \leq x \leq 1$) which is optically transparent to the emission wavelength and lattice-matched to the AlGaInP-based material to compose the light-emitting portion. The p-type buffer layer 6 has a thickness t of a diffusion length or more of Zn doped in the p-type contact layer 7.

The p-type buffer layer 6 is an AlGaAs layer with a high Al composition, optically transparent to the emission wavelength of an LED device composed of an AlGaInP-based material, easier to grow its crystal than a four-element material such as AlGaInP, and almost lattice-matched to the AlGaInP-based material to compose the light-emitting portion. Thus, the p-type buffer layer 6 is formed of the material capable of lowering the operating voltage of the LED device.

Figure 2A:
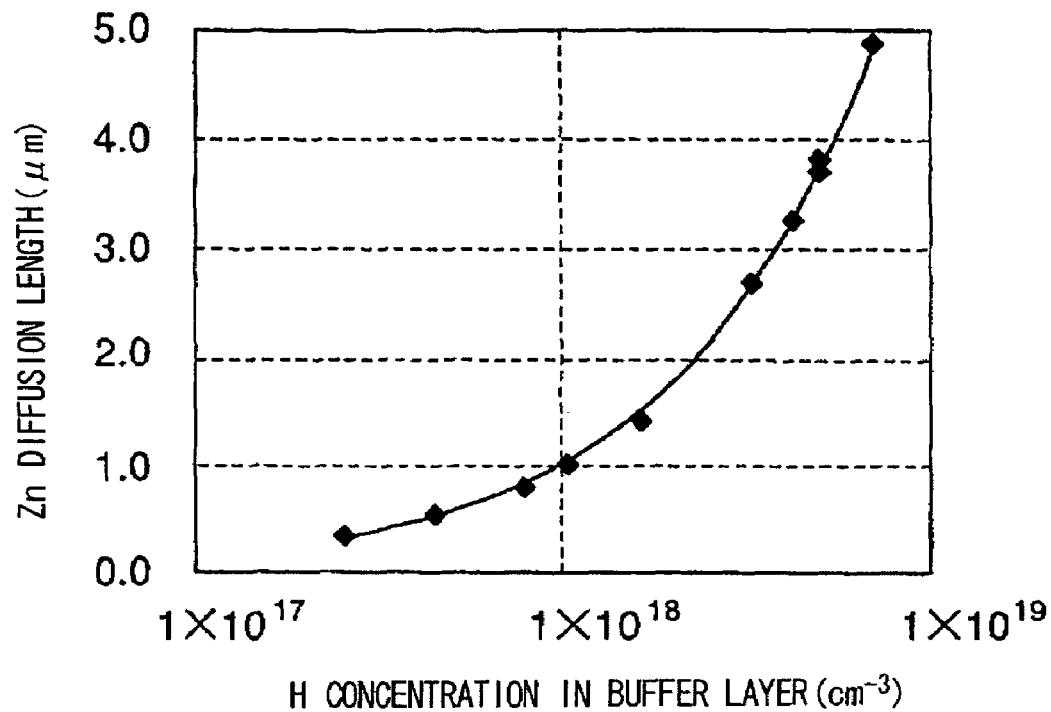
FIG. 2A is a graph showing a relationship between an H concentration of a buffer layer and a diffusion length of Zn in Examples 1-4 of the invention.

The diffusion length of Zn doped in the p-type contact layer 7 has, as shown in FIG. 2A, a correlation with a concentration of H (hydrogen) contained in the p-type buffer layer 6. The Zn diffusion length is represented by an expression: $L = 6.869 \times 10^{-15} \times N_H^{0.788}$, where $N_H$ is an H concentration [$cm^{-3}$] in the buffer layer and L is a diffusion length [μm] of a dopant doped in the p-type contact layer 7.

In this embodiment, the H concentration in the p-type buffer layer 6 is set such that the thickness t of the p-type buffer layer 6 is greater than the Zn diffusion length L obtained by the above expression or from the curve in FIG. 2A. The setting of H concentration is closely controlled in consideration of parameters such as the V/III ratio during the growth of the p-type buffer layer 6 or Al composition of the p-type buffer layer 6.

For example, when the p-type buffer layer 6 has a thickness of 5 μm, the H concentration in the p-type buffer layer 6 is set to be $3 \times 10^{18}/cm^3$. The diffusion length of Zn doped in the p-type contact layer 7 is obtained by the above expression or from the curve in FIG. 2A to be about 2.5 µm, which falls within the thickness of the p-type buffer layer 6. Thereby, the Zn diffusion from the p-type contact layer 7 can be prevented, and, therefore, the interdiffusion between Zn of the p-type contact layer 7 and Mg of the other p-type semiconductor layers 5, 6 can be effectively prevented.

The inventors found that the interdiffusion reaction between Zn of the p-type contact layer 7 and Mg of the p-type cladding layer 5 and the p-type buffer layer 6 is in close relation with the H concentration in the p-type buffer layer 6, and that this phenomenon is significant especially when the p-type buffer layer 6 comprises an AlGaAs layer with a high Al composition. Therefore, since the H concentration of the p-type buffer layer 6 can be set by controlling closely the parameters such as the V/III ratio during the growth of the p-type buffer layer 6 or Al composition of the p-type buffer layer 6, the thickness of the p-type buffer layer 6 can be suitably set so as to control the interdiffusion distance between Zn and Mg, and a long lifetime LED device can be obtained.

In this embodiment, between the n-type GaAs substrate 1 and the n-type cladding layer 3, e.g., between the n-type GaAs buffer layer 3 and the n-type cladding layer 3, a light reflecting layer may be formed which comprises 10 pairs or more and 30 pairs or less of two semiconductor layers different in refractive index, made of high-refractive index material and low-refractive index material, respectively.

Further, in this embodiment, between the active layer 4 and the p-type cladding layer 5 or between the active layer 4 and the n-type cladding layer 3, a diffusion-suppressing layer may be formed, which comprises any one or a combination of an undoped semiconductor layer, a semiconductor layer with a lower dopant concentration than the p-type cladding layer 5, and a semiconductor layer doped with an n-type dopant and a p-type dopant simultaneously to be neutral in pseudo conduction type. The diffusion-suppressing layer has desirably a thickness of 300 nm or less when it is inserted between the active layer 4 and the p-type cladding layer 5. Alternatively, it has desirably a thickness of 200 nm or less when it is inserted between the active layer 4 and the n-type cladding layer 3.

The reasons for employing the LED structure as described in this embodiment will be explained below.

(1) First, the thickness of the AlGaAs-based buffer layer 6 of the embodiment is set based on that it needs to prevent the dopant doped into the p-type semiconductor from penetrating into the active layer 4 due to the interdiffusion between Zn doped in the p-type contact layer 7 and Mg doped in the other p-type semiconductor layers 5, 6 so as to offer an LED device with a long lifetime and a high reliability.

The inventors found that the interdiffusion between Zn and Mg is in close relation with the concentration of H contained in the p-type buffer layer 6, and that the diffusion length (or diffusion distance) of the impurities can be controlled by the concentration of H contained in the p-type buffer layer 6. This can be known by the experimental result to indicate the relationship between the H concentration in the p-type buffer layer 6 and the diffusion length of Zn as shown in FIG. 2A. Based on this result, the diffusion length of Zn doped in the p-type contact layer 7 can be obtained by the expression: $L=6.869\times10^{-15}\times N_H^{0.788}$, where $N_H$ is an H concentration [cm$^{-3}$] of the buffer layer and L is a diffusion length [µm] of a dopant doped in the p-type contact layer 7. Thus, in the embodiment, since the AlGaAs buffer layer 6 has a thickness t equal to or more than the Zn diffusion length L obtained by the expression, the LED device can achieve a good property both in initial characteristics and reliabilities.

Meanwhile, it is not always necessary to specify the upper limit of the thickness t of the buffer layer 6. In other words, as the thickness is increased from the suitable thickness (i.e., the thickness t), the following situations will occur.

The current-spreading property of the LED device can be sufficiently obtained by the current-spreading layer 8, such as ITO or ZnO transparent conductive film, made of metal oxide and formed on the contact layer 7. Thus, the buffer layer 6 is not always necessary to have the current-spreading property. Even if the buffer layer 6 has a thickness, e.g., 10 µm, or more than the suitable thickness, the output of the LED device cannot be increased significantly since the current-spreading layer 8 is predominant in current-spreading effect. On the contrary, a disadvantage will arise that the manufacturing cost of the LED device is increased by the increased thickness to raise the production cost of the LED device. In consideration of this, it is suitable in production aspect that the thickness of the buffer layer 6 is set to be around the suitable thickness as described above.

(2) Second, the ohmic contact layer contacting the current-spreading layer made of metal oxide, e.g., the ITO film 8, is necessary to be doped with a dopant at a very high concentration so that it has a very high carrier concentration.

For example, in case of the contact layer 7 doped with Zn, its crystal material has desirably an Al mixture ratio of 0 to 0.4, i.e., GaAs to Al0.4GaAs. Its carrier concentration is suitably $1\times10^{19}$/cm$^3$ or more, which is further preferred as it is higher.

The ITO film 8 belongs basically to n-type semiconductor. The LED device is generally fabricated p-side up. Thus, the LED device using the ITO film 8 as the current spreading layer has, in conductivity type, a junction of n/p/n viewing from the substrate side. Therefore, the LED device has a large potential barrier generated at the interface between the ITO film 8 and the p-type semiconductor layer, and the LED device must have generally a very high operating voltage.

To solve this problem, the p-type semiconductor layer needs to be a p-type semiconductor layer with a very high carrier concentration. The reason why the contact layer 7 has a narrow bandgap is that the high carrier concentration can be facilitated by such a narrow bandgap. In connection with the high carrier concentration of the contact layer 7, it is important that the current-spreading layer, e.g., the ITO film 8, contacting the contact layer 7 has a high carrier concentration, so as to reduce the tunnel voltage. For the same reason as the contact layer 7, it has preferably a carrier concentration of $7\times10^{20}$/cm$^3$ or more.

The transparent conductive film (i.e., the current-spreading layer 8 in the embodiment) with a carrier concentration of $7\times10^{20}$/cm$^3$ or more is formed by a vacuum deposition method or a sputtering method. It is known that especially, a DC sputtering method with RF superposed thereon is effective to produce a transparent conductive film with a very high carrier concentration. The other methods such as a coating method using MOD (metal organic deposition) solution or spray pyrolysis deposition can be used. However, they are not desirable since it is difficult to obtain a transparent conductive film with a high carrier concentration by them and an adverse effect may arise during the formation due to heat applied to its epitaxial wafer.

(3) Third, it is preferred that the contact layer 7 has a thickness of 1 nm or more and 30 nm or less. This is because the contact layer 7 has a bandgap to be an absorption layer or the like to light emitted from the active layer 4, and the optical output lowers as the thickness thereof increases.

Figure 6:
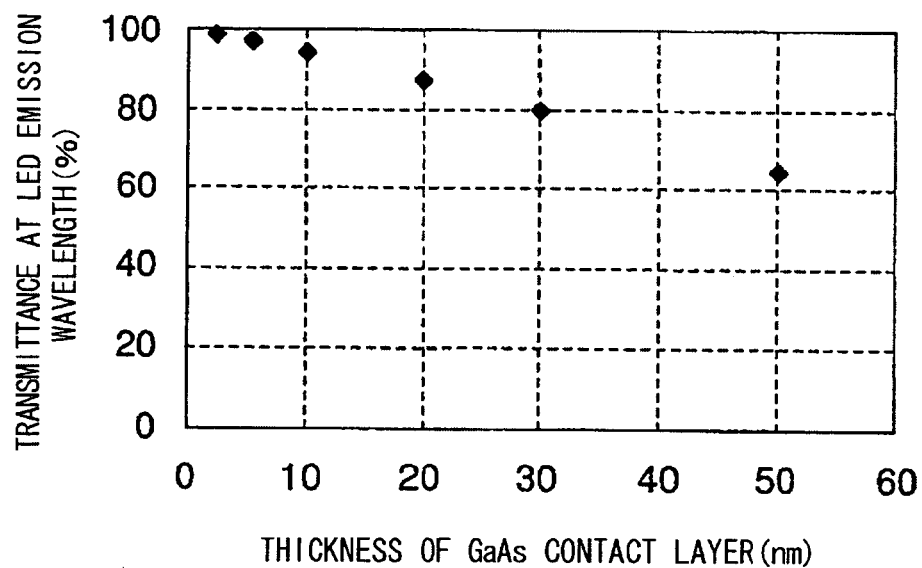
FIG. 6 is a graph showing a relationship between a thickness of a contact layer and a transmittance at an LED emission wavelength.

FIG. 6 is a graph showing a relationship between a thickness of the contact layer 7 and a transmittance at the LED emission wavelength. As shown in FIG. 6, the (visible-light) transmittance at the emission wavelength lowers as the thickness of the contact layer 7 increases. Thus, it is preferred that the thickness of the contact layer 7 is about 30 nm in upper limit to provide the LED device with a high output. If the thickness of the contact layer 7 is less than 1 nm (i.e., several angstroms (Å)), it is difficult to have the tunnel junction between the ITO film 8 and the contact layer 7. Therefore, the operating voltage is difficult to lower and stabilize. Accordingly, it is preferred that the contact layer 7 contacting the ITO film 8 has a thickness of 1 nm to 30 nm.

(4) Fourth, it is preferred that the current spreading layer 8 comprising a metal oxide has a thickness in a range of ±30% of d calculated by an expression of: $d = A \times \lambda_p/(4 \times n)$, where A is a constant (A=1 or 3), $\lambda_p$ is an emission peak wavelength (nm) of the LED device, and n is a refractive index.

The ITO film 8 exemplified as the current-spreading layer formed on the LED epitaxial wafer has a refractive index nearly in the middle of the semiconductor layer and the air layer, and it functions optically as a reflection preventing film. Thus, in order to increase the light extraction efficiency to enhance the optical output of the LED device, it is preferred that it has a thickness according to the above expression.

Figure 7:
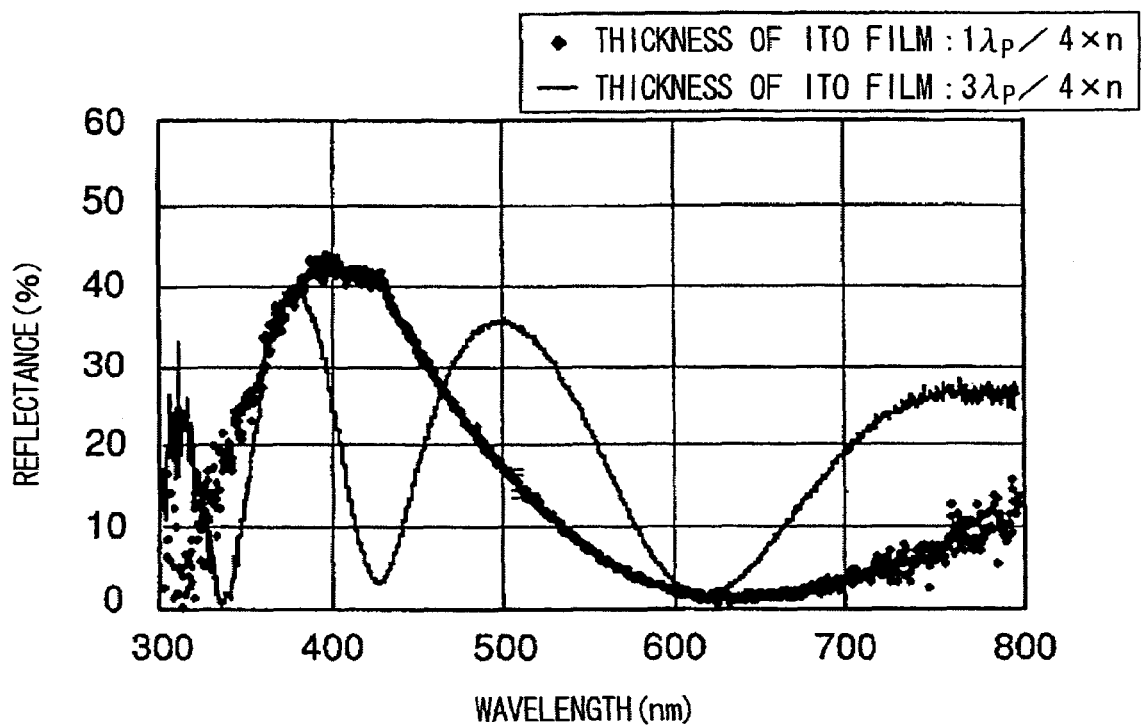
FIG. 7 is a diagram showing reflectance spectra of an ITO film formed on a GaAs substrate.

However, as the ITO film 8 increases in thickness, the transmittance may degrade. If the intrinsic transmittance of the ITO film 8 lowers, a rate of light absorbed by the ITO film 8 after being emitted from the active layer 4 increases. As a result, the optical output will lower. Further, as the current-spreading layer 8 increases in thickness, the optical interference in the current spreading layer will increase and wavelength region with high light extraction efficiency will be narrowed. In this regard, FIG. 7 shows the measurement result that, preparing a sample that the ITO film 8 is formed on the GaAs substrate 1, spectra of reflected light is measured when light is incident perpendicularly to this sample.

For these reasons, the preferred thickness d of the current spreading layer is determined by the expression, where the constant A is preferably 1 or 3, most preferably A=1. The ITO film 8 exemplified as the current spreading layer formed on the LED epitaxial wafer has desirably a thickness in the range of ±30% of d calculated by the expression. This is because a wavelength band, i.e., a wavelength band with high light extraction efficiency, with an optically low reflectivity to serve as a reflection preventing film has a certain width. For example, tolerance in thickness of the reflection preventing film to have a reflectivity of 15% or less when light is incident perpendicularly to the LED epitaxial wafer is in the range of ±30% of d calculated by the relational expression. If d exceeds ±30%, the effect of the reflection preventing film lowers and the optical output of the LED device lowers relatively.

(5) Fifth, the diffusion suppressing layer formed neighboring the active layer 4 has preferably a thickness of 300 nm or less when it is inserted between the active layer 4 and the p-type cladding layer 5, and 200 nm or less when it is inserted between the active layer 4 and the n-type cladding layer 3. The reasons for the upper limits in thickness are as described below.

With regard to the former upper-limit thickness (300 nm or less), as intended by the invention, the dopant will not be diffused and much penetrated into the active layer 4 since the interdiffusion between the p-type dopants, Zn and Mg, can be suppressed effectively by controlling suitably the H (hydrogen) concentration and thickness of the buffer layer 6. However, if the thickness of the buffer layer 6 is not set to have a safety margin, or depending on an error in dopant concentration or thickness during the epitaxial growth, the penetration of the dopant into the active layer 4 may arise. Even in this case, by forming the diffusion suppressing layer between the active layer 4 and the p-type cladding layer 5 as well as controlling suitably the H concentration and thickness of the buffer layer 6, the lifetime and stability of the LED device can be enhanced. However, it is not always suitable to increase simply the thickness of the diffusion suppressing layer, and the thickness is to be under the upper limit as described above. Namely, if the diffusion suppressing layer is too thick, carrier (i.e., hole) cannot be efficiently injected from the p-type cladding layer 5. Thereby, the forward voltage of the LED device will be increased so that properties required for the LED device will degrade. Thus, it is preferable that the diffusion suppressing layer formed between the active layer 4 and the p-type cladding layer 5 has suitably a thickness of 300 nm or less, more suitably 200 nm or less.

With regard to the latter upper-limit thickness (200 nm or less), for the same reason as the diffusion suppressing layer formed on the side of the p-type cladding layer 5, the n-type dopant doped in the n-type cladding layer 3 may be not a little diffused into the active layer 4. Also, even though the diffusion distance is short, the n-type dopant doped in the n-type cladding layer 3 may be diffused into the active layer 4 by so-called memory effect during the growth of the n-type cladding layer 3 and the active layer 4. Due to the diffusion of the n-type dopant, the optical output of the LED device will lower. To solve this problem, it is desirable to form the diffusion suppressing layer between the active layer 4 and the n-type cladding layer 3. The diffusion suppressing layer has suitably the upper limit in thickness, i.e., 200 nm or less, which is based on the same reasons as the diffusion suppressing layer formed on the side of the p-type cladding layer 5, more suitably 100 nm or less.

Figure 8:
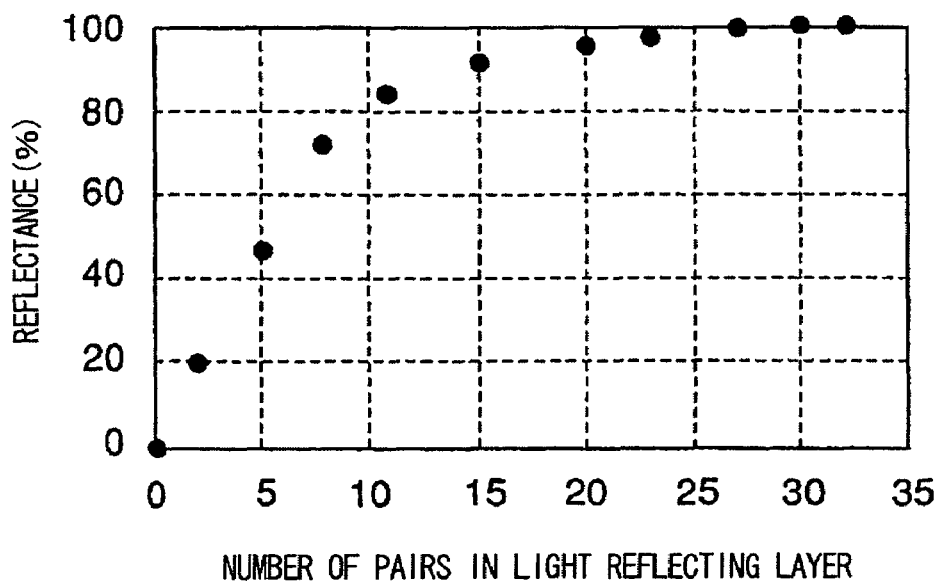
FIG. 8 is a graph showing a relationship between the number of pairs in light reflecting layer and a perpendicular reflectance.

(6) Sixth, it is preferred that the total number of pairs in the light reflecting layer is in the range of 10 to 30 pairs. The lower limit is set to be 10 because 10 pairs are needed to have a sufficient reflectivity in the light reflecting layer. In this regard, FIG. 8 shows the relationship between the number of pairs in the light reflecting layer and the perpendicular reflectivity.

The reasons for the upper limit are as follows.

Even if the light reflecting layer is thickened so much, the reflectivity or the optical output of the LED device is not always increased by that much. As shown in FIG. 8, the reflectivity of the light reflecting layer tends to be almost saturated at 20 and a few pairs or more, being completely saturated at 30 pairs or more. Thus, the number of pairs needs to be more than a certain number in order to have an effective reflectivity. In addition, in order to fabricate the LED device and LED epitaxial wafer at low cost and efficiently, it is preferred that the number of pairs in the light reflecting layer has an upper limit.

According to the above reasons, the number of pairs is to be selected in the range of 10 to 30 pairs, more preferably 15 to 25 pairs.

Materials suitable for the light reflecting layer can be $Al_xGa_{1-x}As$ ($0.4 \leq X \leq 1$) or $(Al_xGa_{1-x})_yIn_{1-y}P$ ($0 \leq X \leq 1$ and $0.4 \leq Y \leq 0.6$). The reason for selecting these materials is that they are almost lattice-matched to the GaAs substrate 1 and optically transparent to a wavelength of light emitted from the LED device. It is known that, as a difference in refractive index between two materials to compose the DBR, i.e., the light reflecting layer, is increased, the reflection wavelength band of light is broadened and the reflectivity is increased. Therefore, it is preferred that the above materials are selected.

(7) Seventh, it is preferred that the buffer layer 6 comprises $Al_xGa_{1-x}As$ ($0.4 \leqq X \leqq 1$). The reason for selecting this range is that the buffer layer 6 is located on the side of the light extracting surface of the LED device, i.e., on the surface side of the LED device, and therefore it is advantageous in optical output that it is transparent to light emitted from the LED. If it comprises AlGaAs out of the range, it is not preferable from the viewpoint of obtaining a high-output LED device although the effects of the invention are not harmed.

(8) Eighth, it is preferred that the p-type cladding layer 5 has an Mg concentration in the range of $1 \times 10^{17}$ to $5 \times 10^{18}/cm^3$. The reasons for specifying the lower limit ($1 \times 10^{17}/cm^3$) are that, if the Mg concentration is less than the lower limit, the carrier concentration of the layer 5 becomes so low that it is difficult to have a sufficient effect as the carrier supply layer, whereby the optical output of the LED device is reduced. The reasons for specifying the upper limit ($5 \times 10^{18}/cm^3$) are that, if Mg is doped excessively, crystal defects will arise in the p-type cladding layer 5 nearly according to the Mg concentration so that the diffusion of the dopant is prompted to reduce the internal quantum efficiency of the LED, thus causing a reduction in optical output in the LED device.

EXAMPLES OF THE FIRST EMBODIMENT

The first embodiment of the invention will be further detailed below in Examples 1-4 and Comparative Examples 1-2.

Example 1

In Example 1, a red LED epitaxial wafer with a structure as shown in FIG. 1 and an emission wavelength of about 630 nm is fabricated. Its epitaxial growth method, epitaxial layer thickness, epitaxial layer structure, electrode formation method, and LED device fabrication method will be explained below.

On the n-type GaAs substrate 1 doped with Si, by the MOVPE method, the n-type (Si-doped) GaAs buffer layer 2 (with a thickness of 200 nm and a carrier concentration of $1 \times 10^{18}/cm^3$), the n-type (Si-doped) $(Al_{0.7}Ga_{0.3})_{0.5}In_{0.5}P$ cladding layer 3 (with a thickness of 400 nm and a carrier concentration of $1 \times 10^{18}/cm^3$), the undoped $(Al_{0.1}Ga_{0.9})_{0.5}In_{0.5}P$ active layer 4 (with a thickness of 600 nm), the p-type (Mg-doped) $(Al_{0.7}Ga_{0.3})_{0.5}In_{0.5}P$ cladding layer 5 (with a thickness of 400 nm and a carrier concentration of $1.2 \times 10^{18}/cm^3$), the p-type (Mg-doped) $(Al_{0.85}Ga_{0.15})As$ buffer layer 6 (with a thickness of 5 μm and a carrier concentration of $2 \times 10^{18}/cm^3$), and the p-type (Zn-doped) $Al_{0.1}Ga_{0.9}As$ contact layer 7 (with a thickness of 3 nm and a carrier concentration of $7.7 \times 10^{19}/cm^3$) are sequentially grown in lamination.

The growth temperature in the MOVPE growth is set at 650° C. from the n-type GaAs buffer layer 2 to the p-type buffer layer 6, and the growth temperature of the p-type contact layer 7 is set at 550° C. The other growth conditions are a growth pressure of about 6666 Pa (50 Torr), a growth rate of the respective layers in the range of 0.3 to 1.1 nm/sec, and a V/III ratio of about 150. However, the p-type contact layer 7 has a V/III ratio of 11. The p-type buffer layer 6 is made of AlGaAs with an Al composition of about 0.8 to 0.9 and the V/III ratio during the growth (in this case, about 50 in V/III ratio) is set such that the H (hydrogen) concentration of the p-type buffer layer 6 is about $3 \times 10^{18}/cm^3$. Herein, the V/III ratio is a ratio (quotient) obtained by a denominator, which is the number of moles of a group III material such as TMGa or TMAl, and a numerator, which is the number of moles of a group V material such as $AsH_3$ or $PH_3$.

A material used in the MOVPE growth can be an organic metal such as trimethyl gallium (TMGa) or triethyl gallium (TEGa) for Ga source, trimethyl aluminum (TMAl) for Al source and trimethyl indium (TMIn) for In source, or a hydride gas such as arsine ($AsH_3$) for As source and phosphine ($PH_3$) for P source. A dopant material for an n-type layer such as the n-type buffer layer 2 can be disilane ($Si_2H_6$). A dopant material for a conductivity-determining impurity of a p-type layer such as the p-type clad layer 5 and the p-type buffer layer 6 can be biscyclopentadienyl magnesium ($Cp_2Mg$). However, diethyl zinc (DEZn) is used only for the p-type contact layer 7.

Furthermore, a dopant material for a conductivity-determining impurity of an n-type layer can be also hydrogen selenide ($H_2Se$), monosilane ($SiH_4$), diethyl tellurium (DETe) and dimethyl tellurium (DMTe). A Zn source can be also dimethyl zinc (DMZn).

Then, after the LED epitaxial wafer is taken out from the MOVPE furnace, the ITO film 8 with a thickness of about 80 nm is formed by the vacuum deposition method on the surface of the wafer, i.e., the upper surface side of the p-type contact layer 7. In this structure, the ITO film 8 composes the current spreading layer.

At this time, an evaluating glass substrate set in the same batch as for the deposition of the ITO film 8 is taken out and cut into a size enough for the Hall measurement, and the electric characteristics of only the ITO film 8 are evaluated. As a result, a carrier concentration is $1.15 \times 10^{21}/cm^3$, a mobility is 16.3 $cm^2/Vs$, and a resistivity is $3.32 \times 10^{-4} \Omega \cdot cm$.

Then, the surface electrode 9 as a circular electrode and with a diameter of about 120 μm is provided in the form of a dot matrix on the upper surface of the epitaxial wafer by the vacuum deposition method by using tools or materials used for a general photolithography process such as a resist and a mask aligner. A liftoff method is used in electrode formation after the deposition. The surface electrode 9 is formed by sequentially depositing Ni (nickel) and Au (gold) with thicknesses of 20 nm and 500 nm, respectively. Furthermore, on the entire bottom surface of the epitaxial wafer, the back surface electrode 10 is formed by the same vacuum deposition method. The back surface electrode 10 is formed by sequentially depositing AuGe (gold-germanium alloy, germanium content of 7.4%), Ni (nickel), and Au (gold) with thicknesses of 60 nm, 10 nm, and 500 nm, respectively. Then, an alloy process to alloy the electrode is performed such that the electrode is heated at 440° C. in a nitrogen gas atmosphere for 5 minutes.

Then, the LED epitaxial wafer with the electrode formed as described above is cut by a dicer such that the circular surface electrode 9 is located at the center, so as to obtain an LED bear chip with a chip size of 300 μm square. Then, the LED bear chip is mounted (die-bonding) through an Ag paste on a TO-18 stem. Then, the LED bear chip is wire-bonded to have the LED device.

Initial characteristics of the LED device thus fabricated are evaluated. As a result, the LED device has excellent initial characteristics, i.e., an optical output of 1.01 mW and an operating voltage of 1.842 V during the power feeding at 20 mA (in evaluation).

Furthermore, a continuous current test for 168 hours (=1 week) is conducted where the LED device is driven at 50 mA in the environment of room temperature (about 23° C.) and atmospheric humidity (about 40%). As relative values as compared to those before the test, optical output is 102.2% (provided that optical output before the power feeding is 100%; hereinafter referred to as a relative output), and operation voltage is 1.843 V (about 0.1% increased).

SIMS analysis is conducted for the LED device just after the formation of the LED device and for the LED device after the continuous current test under the above conditions.

Figure 12:
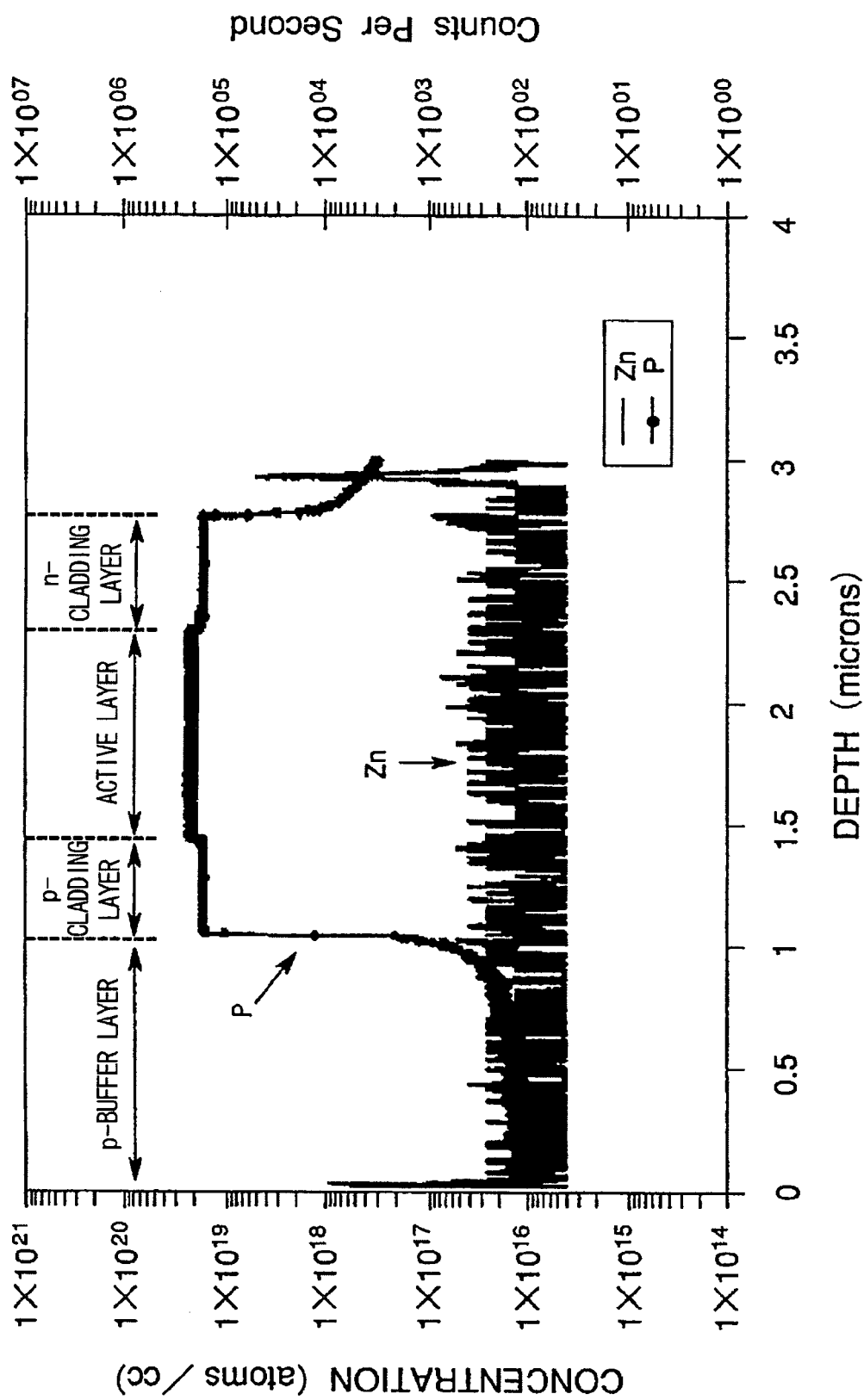
FIG. 12 is a diagram showing a result of SIMS analysis in Examples 1 and 5 of the invention.

FIG. 12 is a diagram showing the result of SIMS analysis after the continuous current test. Meanwhile, the LED device sample as used in FIG. 12 is prepared such that its surface is removed several micrometers by mechanical polishing so as to enhance the measurement resolution of the SIMS analysis.

As the result of the SIMS analysis, it is confirmed that the H (hydrogen) concentration of the AlGaAs buffer layer 6 is about $3 \times 10^{18}/cm^3$ both before and after the continuous current test, and that, in the LED device of Example 1 after the continuous current test, Zn is not diffused into the active layer 4.

Figure 13A:
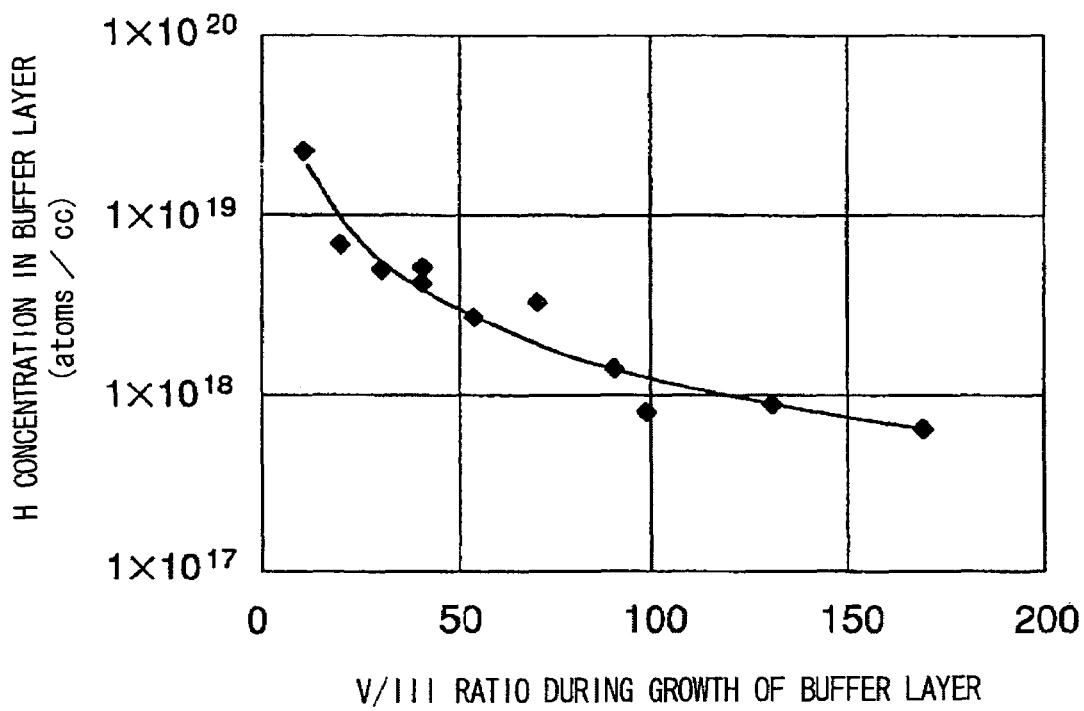
FIG. 13A is a graph showing a relationship between a V/III ratio during the growth of a buffer layer and an H concentration in the buffer layer.

In consideration of the above results, the H concentration of the buffer layer 6 is measured by the SIMS analysis while varying the V/III ratio during the formation of the AlGaAs buffer layer 6. FIG. 13A shows the measurement result. As shown in FIG. 13A, it is confirmed that the H concentration of the buffer layer 6 well correlates with the V/III ratio during the formation of the AlGaAs buffer layer 6. However, the H concentration of the buffer layer 6 is not determined simply by the V/III ratio, and it also depends on the growth temperature or the Al composition of the buffer layer 6. Thus, the control of the H concentration is not limited only to the V/III ratio.

Further, using samples fabricated varying the V/III ratio as shown in FIG. 13A, the diffusion length of Zn doped in the contact layer 7 in the LED structure as described in Example 1 is measured. The relationship between the H concentration of the AlGaAs buffer layer and the Zn diffusion length is shown in FIG. 2A. FIG. 2A shows that the Zn diffusion length depends on the H concentration of the AlGaAs buffer layer. This result is represented by the expression: $L=6.869 \times 10^{-15} \times N_H^{0.788}$, where $N_H$ is an H (hydrogen) concentration $[cm^{-3}]$ of the buffer layer 6 and L is a diffusion length [μm] of a dopant doped in the p-type contact layer 7. When the AlGaAs buffer layer 6 has a thickness of more than the diffusion length L obtained by the expression, Zn doped in the contact layer 7 is not diffused into the active layer 4 so that the LED device can be excellent both in initial property and reliability. Thus, the excellent properties of the LED device in Example 1 are based on the above reasons. Further, almost all of the LED devices in Example 1 can be fabricated without being broken.

Example 2

Figure 3:
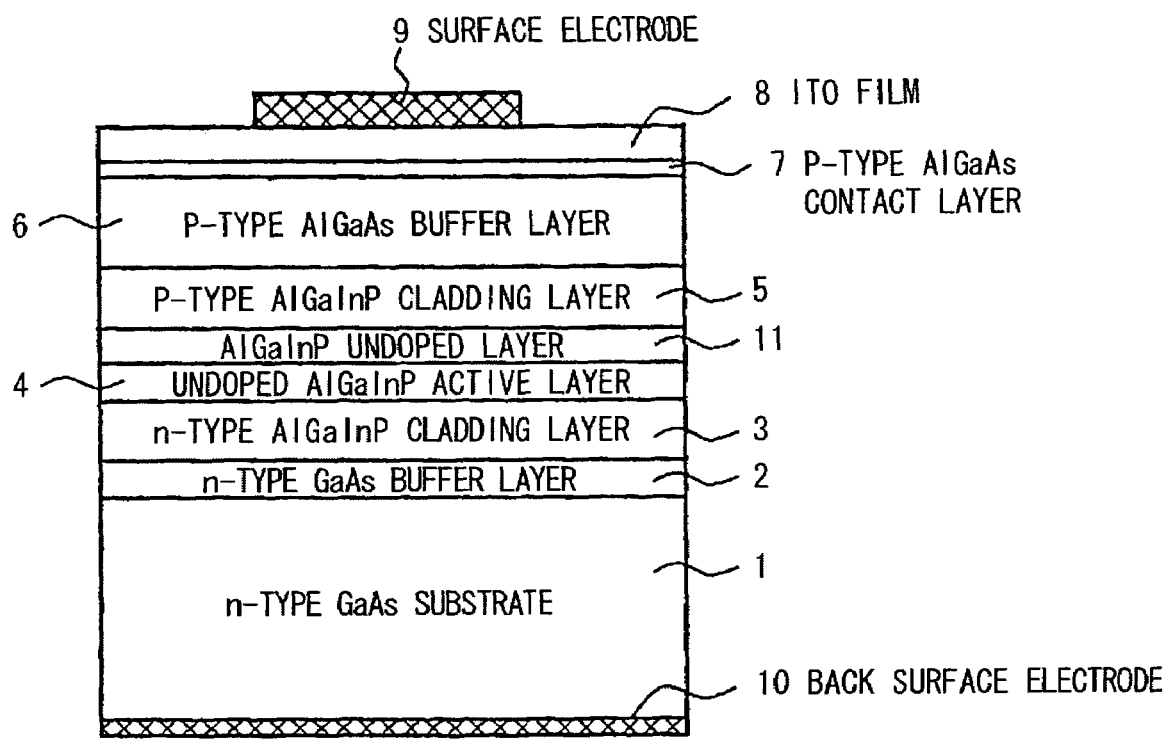
FIG. 3 is a schematic cross sectional view showing an AlGaInP-based red LED in Examples 2 and 6 of the invention.

In Example 2, a red LED epitaxial wafer with a structure as shown in FIG. 3 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1). Different points from Example 1 will be described below.

Example 2 has the feature that a device structure is employed that a semiconductor layer not positively doped, so-called undoped layer, is formed as the diffusion suppressing layer 11 between the active layer 4 and the p-type cladding layer 5. The diffusion suppressing layer 11 serves to prevent the p-type dopant doped into the upper p-type semiconductor layer including the p-type cladding layer 5 from penetrating into the active layer 4. The layer 11 has the same composition as the p-type cladding layer 5, and a thickness of 100 nm.

Figure 9:
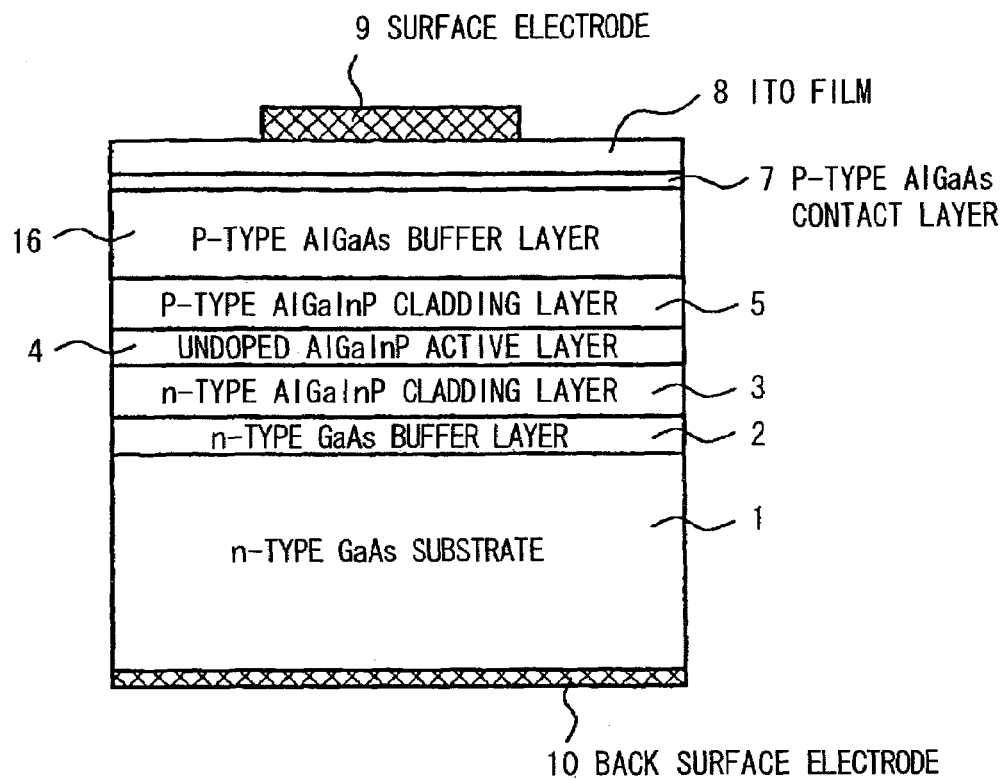
FIG. 9 is a schematic cross sectional view showing an AlGaInP-based red LED in Comparative Examples 1 and 3.

In addition, as a reference example for Example 2, an LED epitaxial wafer is fabricated such that the diffusion suppressing layer 11 is similarly inserted into an LED device as described later in Comparative Example 1 (FIG. 9).

Then, the LED epitaxial wafers thus fabricated are formed into devices as in Example 1.

Initial characteristics of the LED device thus fabricated are evaluated. As a result, the LED device in the reference example has excellent initial characteristics, i.e., an optical output of 0.96 mW and an operating voltage of 1.854 V during the power feeding at 20 mA (in evaluation)

Further, the continuous current test is conducted on the same conditions as Example 1. As a result, the LED device in the reference example has a relative output of 75.3% and an operating voltage of 1.903 V (about 2.3% increased), where the relative output is enhanced as compared to Comparative Example 1 described later.

Then, the LED device in Example 2, i.e., the LED device with the diffusion suppressing layer 11 added to the LED structure in Example 1 as shown in FIG. 3, is evaluated. As a result, the LED device in Example 2 has excellent initial characteristics, i.e., an optical output of 0.98 mW and an operating voltage of 1.843 V during the power feeding at 20 mA (in evaluation).

Further, for the LED device in Example 2, the continuous current test is conducted on the same conditions as Example 1. As a result, the LED device has a relative output of 102.1% and an operating voltage of 1.844 V (about 0.1% increased).

As described above, although the diffusion suppressing layer 11 used in Example 2 does not completely suppressing the diffusion of Zn, the diffusion suppressing layer 11 can serve to reduce the amount of Zn being diffused into the active layer 4. As a result, the LED device in the reference example can have the relative output enhanced as compared to Comparative Example 1 described later. Thus, even when the invention is applied to a device structure not subjected to the diffusion of Zn, the diffusion suppressing layer 11 can offer the similar effect without causing any adverse effect.

Example 3

Figure 4:
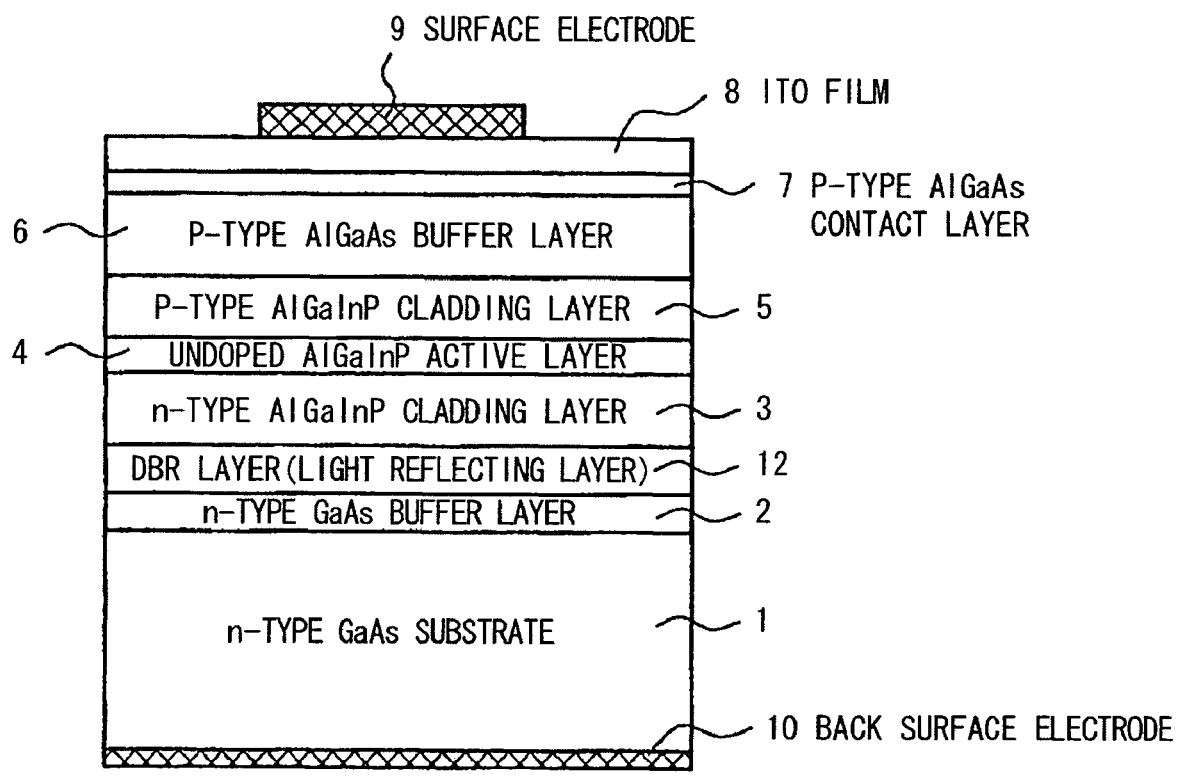
FIG. 4 is a schematic cross sectional view showing an AlGaInP-based red LED in Examples 3 and 7 of the invention.

In Example 3, a red LED epitaxial wafer with a structure as shown in FIG. 4 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

Example 3 has the feature that a light reflecting layer 12 is formed between the n-type GaAs buffer layer 2 and the n-type cladding layer 3 such that it comprises 20 pairs of DBR (distributed Bragg reflector) where an n-type AlInP layers and an n-type $Al_{0.4}Ga_{0.6}As$ layer, 20 layers respectively, are alternately formed.

The light reflecting layer 12 has a thickness obtained by $\lambda_p/(4 \times n)$ where $\lambda_p$ is an emission peak wavelength (nm) of the LED device and n is a refractive index of the semiconductor material to compose the light reflecting layer 12. The light reflecting layer 12 has uniformly a carrier concentration of about $1 \times 10^{18}/cm^3$.

Initial characteristics of the LED device thus fabricated are evaluated. As a result, the LED device in Example 3 has excellent initial characteristics, i.e., an optical output of 1.57 mW and an operating voltage of 1.853 V during the power feeding at 20 mA (in evaluation). Further, as the result of the continuous current test, the LED device in Example 3 has a relative output of 102.0% and an operating voltage of 1.855 V (about 0.1% increased).

As described above, in addition to the effects of Example 1, the LED device in Example 3 can have an optical output higher than that of Example 1 by providing the light reflecting layer 12 of semiconductor multilayer between the n-type buffer layer 2 and the n-type cladding layer 3. This effect is produced by the effective light extraction efficiency enhanced by the light reflecting layer 12.

Example 4

Figure 5:
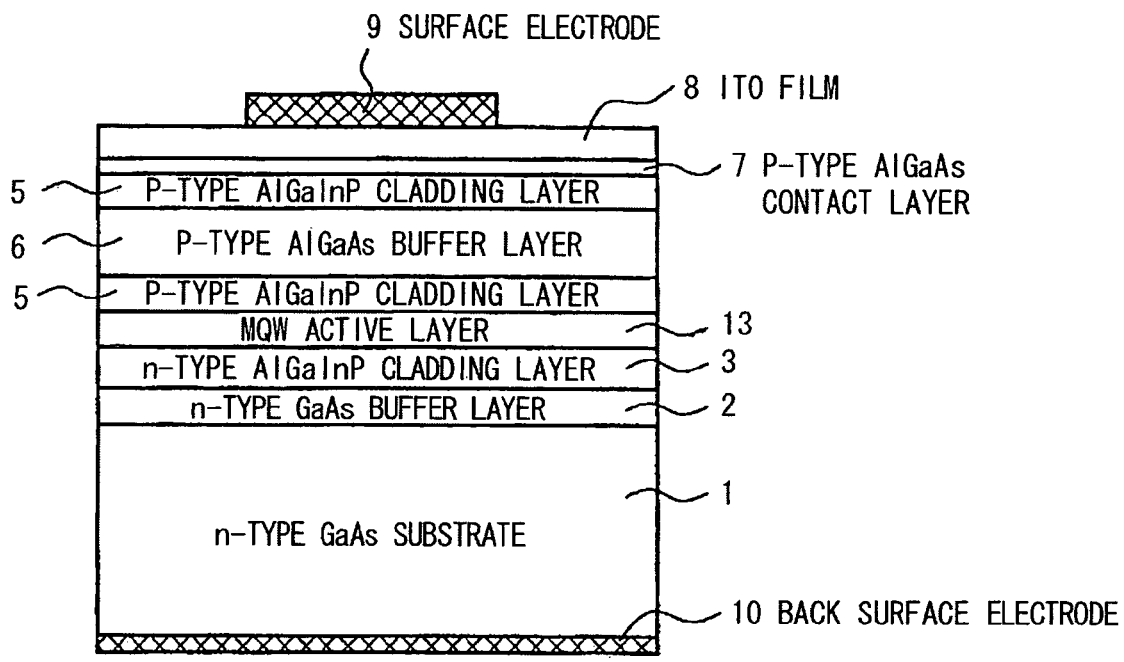
FIG. 5 is a schematic cross sectional view showing an AlGaInP-based red LED in Examples 4 and 8 of the invention.

In Example 4, a red LED epitaxial wafer with a structure as shown in FIG. 5 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

Example 4 has the feature that a MQW (multiquantum well) active layer 13 is used instead of the active layer 4. The MQW is composed of 40.5 pairs of a $(Al_{0.5}Ga_{0.5})_{0.5}In_{0.5}P$ (about 7.5 nm thick) barrier layer and a $Ga_{0.5}In_{0.5}P$ (about 5.5 nm thick) well layer.

A modification of Example 4 is an LED (not shown) that the composition ratio of Ga and In in the well layer of the MQW active layer 13 is changed to have a strained multiquantum well structure so that a compressive or tensile stress is applied to a start GaAs substrate. The well layer with the strained multiquantum well structure in the modification is composed such that the Ga composition is reduced and the In composition is increased by that difference, and it is subjected to a compressive strain caused by a lattice mismatch that the lattice constant of the well layer is different from an underlying layer such as the n-type cladding layer 3.

The two LED devices (Example 4 and the modification) thus fabricated respectively have excellent initial characteristics, i.e., optical outputs of 1.16 and 1.27 mW and operating voltages of 1.843 and 1.844 V during power feeding at 20 mA (in evaluation).

Further, when the continuous current test is conducted under the same conditions as Example 1, the two LED devices have relative outputs of 101.9% and 100.9%, respectively.

As described above, in Example 4 and the modification each employing the MQW and strained multiquantum well structure instead of the active layer 4 of Example 1, the optical output is increases as compared to Example 1. Thus, by employing the quantum well structure, the internal quantum efficiency of the LED device can be increased to enhance the total characteristics of the LED device. Further, the features of Example 1 can be applied to the quantum well structure of Example 4 and the modification.

In Examples 1-4 of the invention, the red LED device with an emission wavelength of 630 nm is fabricated. However, other LED devices made of the same AlGaInP-based material with an emission wavelength of 560 to 660 nm can also have the effects of the invention by setting suitably the H (hydrogen) concentration and the thickness of the buffer layer.

In Examples 1-4 of the invention, the LED device structure is employed that the buffer layer 2 is formed between the GaAs substrate land the n-type cladding layer 3. However, even when the n-type cladding layer 3 is formed directly on the GaAs substrate 1, the effects of the invention can be obtained.

Although Examples 1-4 have the circular surface electrode 9, the other electrode shape such as rectangular, rhombic and polygonal, and further the electrode shape being accompanied with a wing-shaped or branch-shaped portion can be used. Electrodes with such a shape can also have the effects of the invention.

In Examples 1-4, the semiconductor substrate comprises GaAs. Alternatively, an LED epitaxial wafer may comprise a Ge substrate, or GaAs or Ge substrate as a start substrate and then replaced by Si or a metallic self-standing substrate with a higher thermal conductivity than Si. Thereby, the effects of the invention can be obtained.

In Examples 1-4, the buffer layer 6 comprises AlGaAs which has an Al composition in the range of about 0.8 to 0.9. However, the invention is not limited to the Al composition. Even when the Al composition of the AlGaAs buffer layer 6 is not in the above range, or even when the V/III ratio is not in the range of Examples 1-4, there is no problem if only the H (hydrogen) concentration and the thickness of the buffer layer 6 are suitably set according to the invention.

For example, in case of an LED device with an emission wavelength of about 650 nm, even when the Al composition of the AlGaAs buffer layer 6 is in the range of about 0.6 to 0.7, light emitted from the active layer is little absorbed so that the LED device can have a high optical output. In addition, since the H concentration of the buffer layer 6 decreases directly in connection with the reduction in Al composition, the V/III ratio can be set lower than Examples 1-4 using the buffer layer 6 with an Al composition of 0.8 to 0.9.

In case of an LED device with an emission wavelength of about 570 nm, in order to eliminate the optical absorption to be caused by the buffer layer 6, the Al composition of the buffer layer 6 can be set to be around 0.9 so that the V/III ratio can be higher than the conventional one. Thus, even when the fabrication parameters such as a composition of material composing the buffer layer, a V/III ratio during the epitaxial growth and a growth temperature are changed, the effects of the invention can be obtained by satisfying the requirements of the invention.

In Examples 1-4, the current-spreading layer 8 comprises ITO. Instead of the ITO, a typical transparent conductive film such as ZnO and CTO film with a high transmittance for visible light and a low electrical resistivity can be used as the current-spreading layer 8. However, a more important factor for a material used as the current-spreading layer than the above two factors is enhancement in carrier concentration. Since the importance of the carrier concentration is as described above, materials applicable to the current-spreading layer will be limited to some extent in consideration of a reduction in the operating voltage of the LED device. Thus, a suitable material should be selected from the materials.

Comparative Example 1

In Comparative Example 1, a red LED epitaxial wafer with a structure as shown in FIG. 9 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1). Different points from Example 1 will be described below.

Comparative Example 1 is prepared such that the V/III ratio during the growth of a p-type buffer layer 16 is 11 and the H concentration of the p-type buffer layer 16 is $2.3 \times 10^{19}/cm^3$.

Then, the LED epitaxial wafer thus fabricated is formed into devices as in Example 1.

Initial characteristics of the LED device thus fabricated are evaluated. As a result, the LED device in Comparative Example 1 has initial characteristics, i.e., an optical output of 0.90 mW and an operating voltage of 1.856 V during the power feeding at 20 mA (in evaluation).

Further, the continuous current test is conducted on the same conditions as Example 1. As a result, the LED device in Comparative Example 1 has a relative output of 54% and an operating voltage of 1.916 V (about 3% increased).

SIMS analysis is conducted for the LED device just after the formation of the LED device and for the LED device after the continuous current test under the above conditions.

Figure 11:
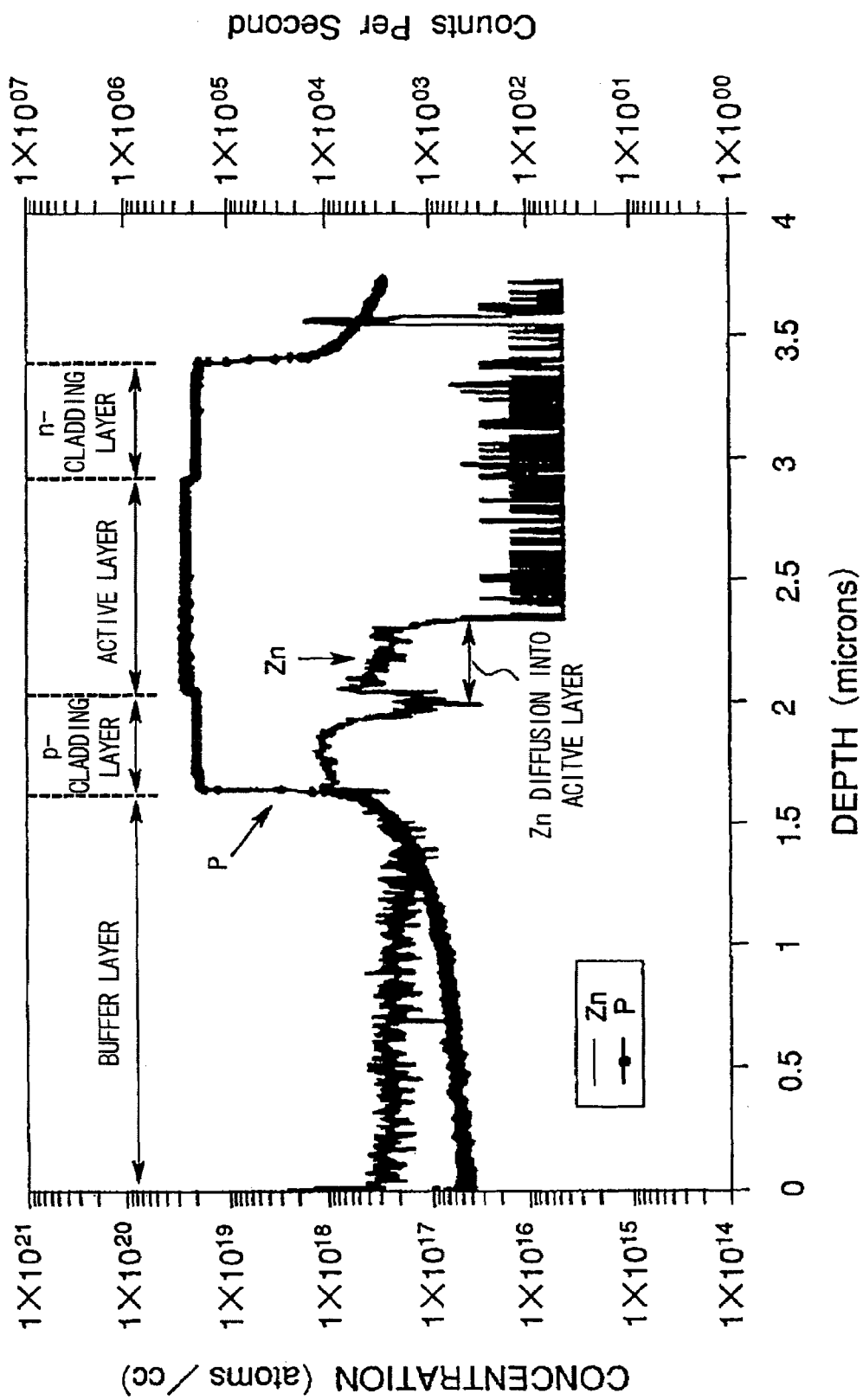
FIG. 11 is a diagram showing a result of SIMS analysis in Comparative Examples 1 and 3.

FIG. 11 is a diagram showing the result of SIMS analysis after the continuous current test. Meanwhile, the LED device sample as used in FIG. 11 is prepared such that its surface is removed several micrometers by mechanical polishing so as to enhance the measurement resolution of the SIMS analysis.

As the result of the SIMS analysis, it is confirmed that the H (hydrogen) concentration of the buffer layer 16 is $2.3 \times 10^{19}/cm^3$ both before and after the continuous current test, and that, in the LED device of Comparative Example 1 after the continuous current test, Zn doped as a dopant into the p-type contact layer 7 is diffused into the active layer 4. Thus, deterioration in lifetime, i.e., reliability in the LED device of Comparative Example 1 is caused by the dopant diffusion into the active layer.

Comparative Example 2

Figure 10:
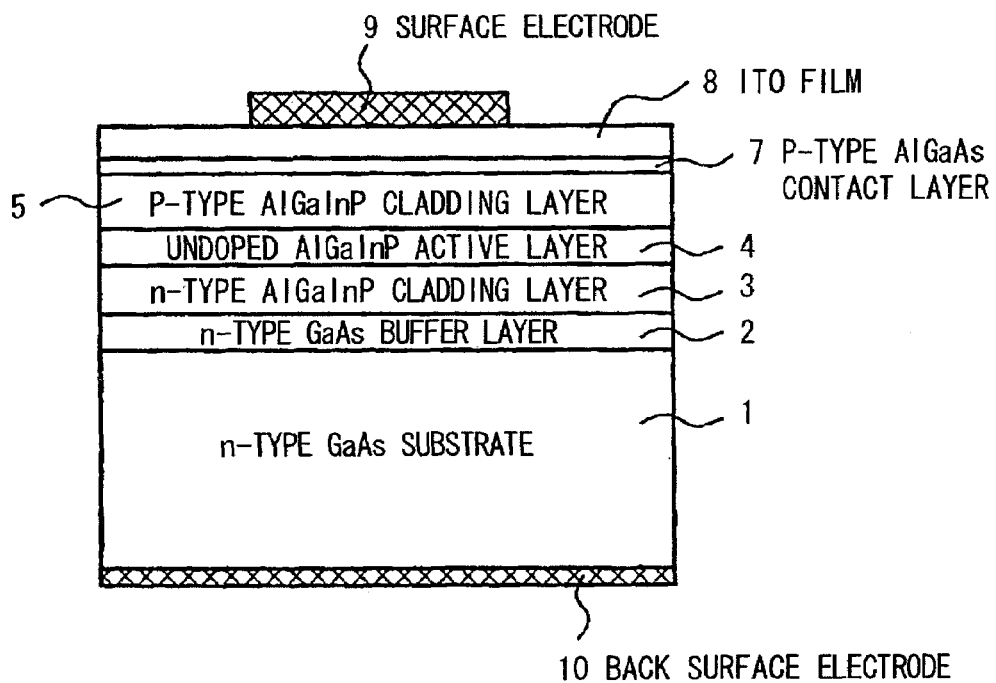
FIG. 10 is a schematic cross sectional view showing an AlGaInP-based red LED in Comparative Examples 2 and 4.

In Comparative Example 2, a red LED epitaxial wafer with a structure as shown in FIG. 10 and an emission wavelength of about 630 nm is fabricated. Its epitaxial growth method, epitaxial layer thickness, epitaxial layer structure, electrode formation method, and LED device fabrication method are basically the same as those in Comparative Example 1 (FIG. 9) Different points from Comparative Example 1 will be described below.

Comparative Example 2 is not formed with the p-type buffer layer 16. The p-type cladding layer 5 has a thickness of about 400 nm, which is enough to have a carrier confining effect and to serve as a carrier (hole) supply layer. Namely, the p-type cladding layer 5 with a thickness of about 400 nm can sufficiently serve as a cladding layer. Thus, the LED device of Comparative example 2 has the same structure as Comparative Example 1 except not having the AlGaAs buffer layer 16.

Then, the LED epitaxial wafer thus fabricated is formed into devices as in Comparative Example 1.

Initial characteristics of the LED device thus fabricated are evaluated. As a result, the LED device in Comparative Example 2 has initial characteristics, i.e., an optical output of 0.88 mW and an operating voltage of 1.843 V during the power feeding at 20 mA (in evaluation).

However, in evaluating the initial characteristics, about 20-30% of the devices are broken so that it does not emit light. Although the device not broken has the abovementioned characteristics, the about 20-30% of the devices broken cannot be evaluated. This is assumed because the device is broken in the wire bonding process before the device evaluation. When the continuous current test is conducted for the devices not broken under the same conditions as Comparative Example 1, the LED device has a relative output of 71% and an operating voltage of 1.853 V (about 0.5% increased).

As described above, in case of the structure without the buffer layer, the product yield deteriorates and the optical output and reliability is not sufficient. Namely, although the relative output is a little improved as compared to Comparative Example 1, the product yield is contrary reduced (In Comparative Example 1, none of the LED devices is broken).

Second Embodiment

FIG. 1 is a cross sectional view showing an AlGaInP-based red LED in the second preferred embodiment of the invention.

The LED comprises, sequentially formed on the n-type GaAs substrate 1 as a semiconductor substrate, the n-type GaAs buffer layer 2, the n-type AlGaInP cladding layer 3 (herein also simply called n-type cladding layer), the undoped AlGaInP active layer 4 (herein also simply called active layer) and the p-type AlGaInP cladding layer 5 (herein also simply called p-type cladding layer 5), where the layers 3-5 are epitaxially grown to compose a light-emitting portion. Further, the p-type (As-based) AlGaAs contact layer 7 (herein also simply called p-type contact layer 7) doped with a p-type dopant at a high concentration is formed on the p-type cladding layer 5. Further, the ITO film (current-spreading layer) 8, which is a current-spreading layer made of a metal oxide and a transparent conductive film, is formed on the p-type contact layer 7. The surface electrode 9 is formed on the surface of the ITO film 8, and the back surface electrode 10 is formed on the back surface of the n-type GaAs substrate 1.

The p-type contact layer 7 is made of $Al_xGa_{1-x}As$ (wherein $0 \leq x \leq 0.4$), and has a thickness of 1 nm or more and 30 nm or less. Zn as a p-type dopant is doped at a high carrier concentration of $1 \times 10^{19}/cm^3$ or more.

The film thickness of the ITO film 8 as the current spreading layer is in a range of ±30% of d calculated by a relational expression of $d = A \times \lambda_p/(4 \times n)$, where A is a constant (A=1 or 3), $\lambda_p$ is an emission wavelength (nm), and n is a refractive index. The ITO film 8 as the current spreading layer is formed by a vacuum deposition method or a sputtering method. The ITO film 8 has preferably a carrier concentration of $7 \times 10^{20}/cm^3$ or more just after the film formation.

A feature of the LED is that the p-type buffer layer 6 is formed between the p-type contact layer 7 and the p-type cladding layer 5, and it comprises a group III/V semiconductor doped with Mg as a p-dopant.

The p-type buffer layer 6 is formed of an $Al_xGa_{1-x}As$ ($0.4 \leq x \leq 1$) which is optically transparent to the emission wavelength and lattice-matched to the AlGaInP-based material to compose the light-emitting portion. The p-type buffer layer 6 has a thickness t of a diffusion length or more of Zn doped in the p-type contact layer 7.

The p-type buffer layer 6 is an AlGaAs layer with a high Al composition, optically transparent to the emission wavelength of an LED device composed of an AlGaInP-based material, easier to grow its crystal than a four-element material such as AlGaInP, and almost lattice-matched to the AlGaInP-based material to compose the light-emitting portion. Thus, the p-type buffer layer 6 is formed of the material capable of lowering the operating voltage of the LED device.

Figure 2B:
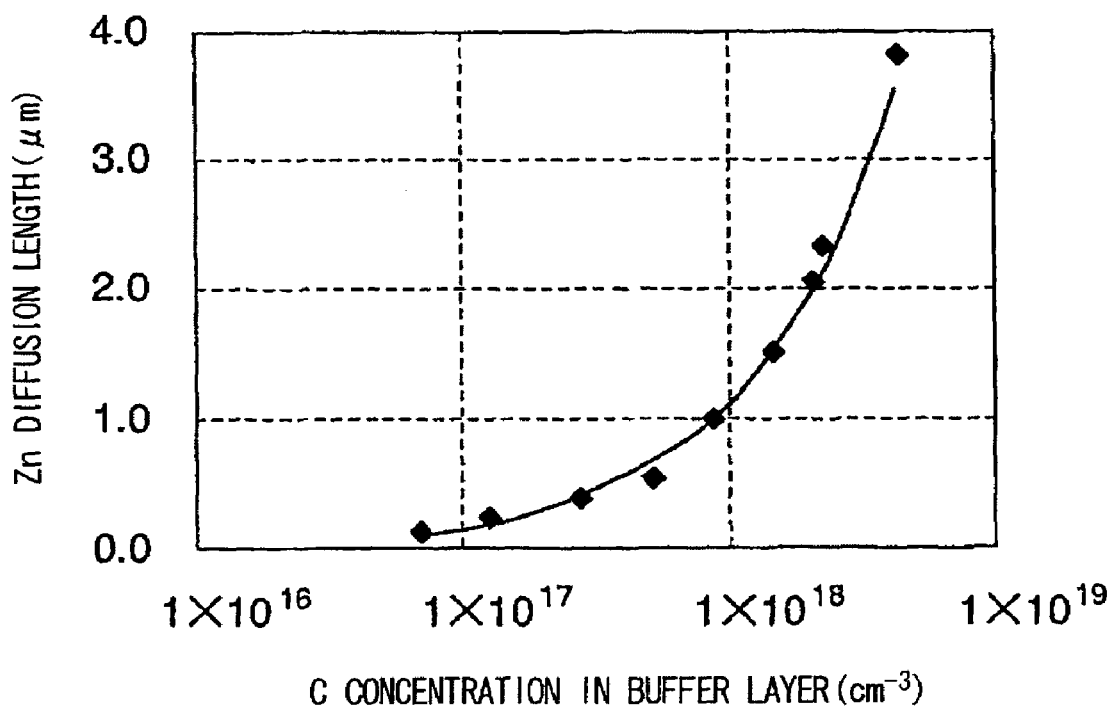
FIG. 2B is a graph showing a relationship between a C concentration of a buffer layer and a diffusion length of Zn in Examples 5-8 of the invention.

The diffusion length of Zn doped in the p-type contact layer 7 has, as shown in FIG. 2B, a correlation with a concentration of C (carbon) contained in the p-type buffer layer 6. The Zn diffusion length is represented by an expression: $L=6.872\times10^{-14}\times N_C^{0.733}$, where $N_C$ is a C concentration [cm$^{-3}$] of the buffer layer and L is a diffusion length [μm] of a dopant doped in the p-type contact layer 7.

In this embodiment, the C concentration in the p-type buffer layer 6 is set such that the thickness t of the p-type buffer layer 6 is greater than the Zn diffusion length L obtained by the above expression or from the curve in FIG. 2B. The setting of C concentration is closely controlled in consideration of parameters such as the V/III ratio during the growth of the p-type buffer layer 6 or Al composition of the p-type buffer layer.

For example, when the p-type buffer layer 6 has a thickness of 5 μm, the C concentration in the p-type buffer layer 6 is set to be $1\times10^{18}$/cm$^3$. The diffusion length of Zn doped in the p-type contact layer 7 is obtained by the above expression or from the curve in FIG. 2B to be about 1.1 μm, which falls within the thickness of the p-type buffer layer 6. Thereby, the Zn diffusion from the p-type contact layer 7 can be prevented, and, therefore, the interdiffusion between Zn of the p-type contact layer 7 and Mg of the other p-type semiconductor layers 5, 6 can be effectively suppressed.

The inventors found that the interdiffusion reaction between Zn of the p-type contact layer 7 and Mg of the p-type cladding layer 5 and the p-type buffer layer 6 is in close relation with the C concentration in the p-type buffer layer 6, and that this phenomenon is significant especially when the p-type buffer layer 6 is an AlGaAs layer with a high Al composition. Therefore, since the C concentration of the p-type buffer layer 6 can be set by controlling closely the parameters such as the V/III ratio during the growth of the p-type buffer layer 6 or Al composition of the buffer layer 6, the thickness of the p-type buffer layer 6 can be suitably set so as to control the interdiffusion distance between Zn and Mg, and a long lifetime LED device can be obtained.

In this embodiment, between the n-type GaAs substrate 1 and the n-type cladding layer 3, e.g., between the n-type GaAs buffer layer 3 and the n-type cladding layer 3, a light reflecting layer may be formed which comprises 10 pairs or more and 30 pairs or less of two semiconductor layers different in refractive index, made of high-refractive index material and low-refractive index material, respectively.

Further, in this embodiment, between the active layer 4 and the p-type cladding layer 5 or between the active layer 4 and the n-type cladding layer 3, a diffusion-suppressing layer may be formed which comprises any one or a combination of an undoped semiconductor layer, a semiconductor layer with a lower dopant concentration than the p-type cladding layer 5, and a semiconductor layer doped with an n-type dopant and a p-type dopant simultaneously to be neutral in pseudo conduction type. The diffusion-suppressing layer has desirably a thickness of 300 nm or less when it is inserted between the active layer 4 and the p-type cladding layer 5. Alternatively, it has desirably a thickness of 200 nm or less when it is inserted between the active layer 4 and the n-type cladding layer 3.

The reasons for employing the LED structure as described in this embodiment will be explained below.

(1) First, the thickness of the AlGaAs-based buffer layer 6 of the embodiment is set based on that it needs to prevent the impurity in the p-type semiconductor from penetrating into the active layer 4 due to the interdiffusion between Zn doped in the p-type contact layer 7 and Mg doped in the other p-type semiconductor layers 5, 6 so as to get an LED device with a long lifetime and a high reliability.

The inventors found that the interdiffusion between Zn and Mg is in close relation with the concentration of C contained in the p-type buffer layer 6, and that the diffusion length (or diffusion distance) of the impurities can be controlled by the concentration of C contained in the p-type buffer layer 6. This can be known by the experimental result to indicate the relationship between the C concentration in the p-type buffer layer 6 and the diffusion length of Zn as shown in FIG. 2B. Based on this result, the diffusion length of Zn doped in the p-type contact layer 7 can be obtained by the expression: $L=6.872\times10^{-14}\times N_C^{0.733}$, where $N_C$ is a C concentration [cm$^{-3}$] of the buffer layer 6 and L is a diffusion length [μm] of a dopant doped in the p-type contact layer 7. Thus, in the embodiment, since the AlGaAs buffer layer 6 has a thickness t equal to or more than the Zn diffusion length L obtained by the expression, the LED device can achieve a good property both in initial characteristics and reliabilities.

Meanwhile, it is not always necessary to specify the upper limit of the thickness t of the buffer layer 6. In other words, as the thickness is increased from the suitable thickness (i.e., the thickness t), the following situations will occur.

The current-spreading property of the LED device can be sufficiently obtained by the current-spreading layer 8, such as ITO or ZnO transparent conductive film, made of metal oxide and formed on the contact layer 7. Thus, the buffer layer 6 is not always necessary to have the current-spreading property. Even if the buffer layer 6 has a thickness, e.g., 10 μm, or more than the suitable thickness, the output of the LED device cannot be increased significantly since the current-spreading layer 8 is predominant in current-spreading effect. On the contrary, a disadvantage will arise that the manufacturing cost of the LED device is increased by the increased thickness to raise the production cost of the LED device. In consideration of this, it is suitable in production aspect that the thickness of the buffer layer 6 is set to be around the suitable thickness as described above.

(2) Second, the ohmic contact layer 7 contacting the current-spreading layer made of metal oxide, e.g., the ITO film 8, is necessary to be doped with a dopant at a very high concentration so that it has a very high carrier concentration.

For example, in case of the contact layer 7 doped with Zn, its crystal material has desirably an Al mixture ratio of 0 to 0.4, i.e., GaAs to Al0.4GaAs. Its carrier concentration is suitably $1\times10^{19}$/cm$^3$ or more, which is further preferred as it is higher.

The ITO film 8 belongs basically to n-type semiconductor. The LED device is generally fabricated p-side up. Thus, the LED device using the ITO film 8 as the current spreading layer has, in conductivity type, a junction of n/p/n viewing from the substrate side. Therefore, the LED device has a large potential barrier generated at the interface between the ITO film 8 and the p-type semiconductor layer, and the LED device must have generally a very high operating voltage.

To solve this problem, the p-type semiconductor layer needs to be a p-type semiconductor layer with a very high carrier concentration. The reason why the contact layer 7 has a narrow bandgap is that the high carrier concentration can be facilitated by such a narrow bandgap. In connection with the high carrier concentration of the contact layer 7, it is important that the current-spreading layer, e.g., the ITO film 8, contacting the contact layer 7 has a high carrier concentration, so as to reduce the tunnel voltage. For the same reason as the contact layer 7, it has preferably a carrier concentration of $7 \times 10^{20}/cm^3$ or more.

The transparent conductive film (i.e., the current-spreading layer 8 in the embodiment) with a carrier concentration of $7 \times 10^{20}/cm^3$ or more is formed by a vacuum deposition method or a sputtering method. It is known that especially, a DC sputtering method with RF superposed thereon is effective to produce a transparent conductive film with a very high carrier concentration. The other methods such as a coating method using MOD (metal organic deposition) solution or spray pyrolysis deposition can be used. However, they are not desirable since it is difficult to obtain a transparent conductive film with a high carrier concentration by them and an adverse effect may arise during the formation due to heat applied to its epitaxial wafer.

(3) Third, it is preferred that the contact layer 7 has a thickness of 1 nm or more and 30 nm or less. This is because the contact layer 7 has a bandgap to be an absorption layer or the like to light emitted from the active layer 4, and the optical output lowers as the thickness thereof increases.

FIG. 6 is a graph showing a relationship between a thickness of the contact layer 7 and a transmittance at the LED emission wavelength. As shown in FIG. 6, the (visible-light) transmittance at the emission wavelength lowers as the thickness of the contact layer 7 increases. Thus, it is preferred that the thickness of the contact layer 7 is about 30 nm in upper limit to provide the LED device with a high output. If the thickness of the contact layer 7 is less than 1 nm (i.e., several angstroms (Å)), it is difficult to have the tunnel junction between the ITO film 8 and the contact layer 7. Therefore, the operating voltage is difficult to lower and stabilize. Accordingly, it is preferred that the contact layer 7 contacting the ITO film 8 has a thickness of 1 nm to 30 nm.

(4) Fourth, it is preferred that the current spreading layer 8 comprising a metal oxide has a thickness in a range of ±30% of d calculated by an expression of: $d = A \times \lambda_p/(4 \times n)$, where A is a constant (A=1 or 3), $\lambda_p$ is an emission peak wavelength (nm) of the LED device, and n is a refractive index.

The ITO film 8 exemplified as the current-spreading layer formed on the LED epitaxial wafer has a refractive index nearly in the middle of the semiconductor layer and the air layer, and it functions optically as a reflection suppressing film. Thus, in order to increase the light extraction efficiency to enhance the optical output of the LED device, it is preferred that it has a thickness according to the above expression.

However, as the ITO film 8 increases in thickness, the transmittance may degrade. If the intrinsic transmittance of the ITO film 8 lowers, a rate of light to be absorbed by the ITO film 8 after being emitted from the active layer 4 increases. As a result, the optical output will lower. Further, as the current-spreading layer 8 increases in thickness, the optical interference will increase in the current spreading layer and wavelength region with high light extraction efficiency will be narrowed. In this regard, FIG. 7 shows the measurement result that, preparing a sample that the ITO film 8 is formed on the GaAs substrate 1, spectra of reflected light is measured when light is incident perpendicularly to this sample.

For these reasons, the preferred thickness d of the current spreading layer is determined by the expression, where the constant A is preferably 1 or 3, most preferably A=1. The ITO film 8 exemplified as the current spreading layer formed on the LED epitaxial wafer has desirably a thickness in the range of ±30% of d calculated by the expression. This is because a wavelength band, i.e., a wavelength band with high light extraction efficiency, with an optically low reflectivity to serve as a reflection suppressing film has a certain width. For example, tolerance in thickness of the reflection suppressing film to have a reflectivity of 15% or less when light is incident perpendicularly to the LED epitaxial wafer is in the range of ±30% of d calculated by the relational expression. If d exceeds ±30%, the effect of the reflection suppressing film lowers and the optical output of the LED device lowers relatively.

(5) Fifth, the diffusion suppressing layer formed neighboring the active layer 4 has preferably a thickness of 300 nm or less when it is inserted between the active layer 4 and the p-type cladding layer 5, and 200 nm or less when it is inserted between the active layer 4 and the n-type cladding layer 3. The reasons for the upper limits in thickness are as described below.

With regard to the former upper-limit thickness (300 nm or less), as intended by the invention, the dopant will not be diffused and much penetrated into the active layer 4 since the interdiffusion between the p-type dopants, Zn and Mg, can be suppressed effectively by controlling suitably the C (carbon) concentration and thickness of the buffer layer 6. However, if the thickness of the buffer layer 6 is not set to have a safety margin, or depending on an error in dopant concentration or thickness during the epitaxial growth, the penetration of the dopant into the active layer 4 may arise. Even in this case, by forming the diffusion suppressing layer between the active layer 4 and the p-type cladding layer 5 as well as controlling suitably the C concentration and thickness of the buffer layer 6, the lifetime and stability of the LED device can be enhanced. However, it is not always suitable to increase simply the thickness of the diffusion suppressing layer, and the thickness is to be under the upper limit as described above. Namely, if the diffusion suppressing layer is too thick, carrier (i.e., hole) cannot be efficiently injected from the p-type cladding layer 5. Thereby, the forward voltage of the LED device will be increased so that properties required for the LED device will degrade. Thus, it is preferable that the diffusion suppressing layer formed between the active layer 4 and the p-type cladding layer 5 has suitably a thickness of 300 nm or less, more suitably 200 nm or less.

With regard to the latter upper-limit thickness (200 nm or less), for the same reason as the diffusion suppressing layer formed on the side of the p-type cladding layer 5, the n-type dopant doped in the n-type cladding layer 3 may be not a little diffused into the active layer 4. Also, even though the diffusion distance is short, the n-type dopant doped in the n-type cladding layer 3 may be diffused into the active layer 4 by so-called memory effect during the growth of the n-type cladding layer 3 and the active layer 4. Due to the diffusion of the impurity, the optical output of the LED device will lower. To solve this problem, it is desirable to form the diffusion suppressing layer between the active layer 4 and the n-type cladding layer 3. The diffusion suppressing layer has suitably the upper limit in thickness, i.e., 200 nm or less, which is based on the same reasons as the diffusion suppressing layer formed on the side of the p-type cladding layer 5, more suitably 100 nm or less.

(6) Sixth, it is preferred that the total number of pairs in the light reflecting layer is in the range of 10 to 30 pairs. The lower limit is set to be 10 because 10 pairs are needed to have a sufficient reflectivity in the light reflecting layer. In this regard, FIG. 8 shows the relationship between the number of pairs in the light reflecting layer and the perpendicular reflectivity.

The reasons for the upper limit are as follows.

Even if the light reflecting layer is thickened so much, the reflectivity or the optical output of the LED device is not always increased by that much. As shown in FIG. 8, the reflectivity of the light reflecting layer tends to be almost saturated at 20 and a few pairs or more, being completely saturated at 30 pairs or more. Thus, the number of pairs needs to be more than a certain number in order to have an effective reflectivity. In addition, in order to fabricate the LED device and LED epitaxial wafer at low cost and efficiently, it is preferred that the number of pairs in the light reflecting layer has an upper limit.

According to the above reasons, the number of pairs is to be selected in the range of 10 to 30 pairs, more preferably 15 to 25 pairs.

Materials suitable for the light reflecting layer can be $Al_xGa_{1-x}As$ ($0.4 \leq X \leq 1$) or $(Al_xGa_{1-x})_yIn_{1-y}P$ ($0 \leq X \leq 1$ and $0.4 \leq Y \leq 0.6$). The reason for selecting these materials is that they are almost lattice-matched to the GaAs substrate 1 and optically transparent to a wavelength of light emitted from the active layer. It is known that, as a difference in refractive index between two materials to compose the DBR, i.e., the light reflecting layer, is increased, the reflection wavelength band of light is broadened and the reflectivity is increased. Therefore, it is preferred that the above materials are selected.

(7) Seventh, it is preferred that the buffer layer 6 comprises $Al_xGa_{1-x}As$ ($0.4 \leq X \leq 1$). The reason for selecting this range is that the buffer layer 6 is located on the side of the light extracting surface of the LED device, i.e., on the surface side of the LED device, and therefore it is advantageous in optical output that it is transparent to light emitted from the LED. If it comprises AlGaAs out of the range, it is not preferable from the viewpoint of obtaining a high-output LED device although the effects of the invention are not harmed.

(8) Eighth, it is preferred that the p-type cladding layer 5 has an Mg concentration in the range of $1 \times 10^{17}$ to $5 \times 10^{18}/cm^3$. The reasons for specifying the lower limit ($1 \times 10^{17}/cm^3$) are that, if the Mg concentration is less than the lower limit, the carrier concentration of the layer 5 becomes too low to have a sufficient effect as the carrier supply layer, whereby the optical output of the LED device is reduced. The reasons for specifying the upper limit ($5 \times 10^{18}/cm^3$) are that, if the Mg is doped excessively, crystal defects will arise in the p-type cladding layer 5 nearly according to the Mg concentration so that the diffusion of the dopant is prompted to reduce the internal quantum efficiency of the LED, thus the optical output of the LED device lowers.

EXAMPLES OF THE SECOND EMBODIMENT

The second embodiment of the invention will be further detailed below in Examples 5-8 and Comparative Examples 3-4.

Example 5

In Example 5, a red LED epitaxial wafer with a structure as shown in FIG. 1 and an emission wavelength of about 630 nm is fabricated. Its epitaxial growth method, epitaxial layer thickness, epitaxial layer structure, electrode formation method, and LED device fabrication method will be explained below.

On the n-type GaAs substrate 1 doped with Si, by using the MOVPE method, the n-type (Si-doped) GaAs buffer layer 2 (with a thickness of 200 nm and a carrier concentration of $1 \times 10^{18}/cm^3$), the n-type (Si-doped) $(Al_{0.7}Ga_{0.3})_{0.5}In_{0.5}P$ cladding layer 3 (with a thickness of 400 nm and a carrier concentration of $1 \times 10^{18}/cm^3$), the undoped $(Al_{0.1}Ga_{0.9})_{0.5}In_{0.5}P$ active layer 4 (with a thickness of 600 nm), the p-type (Mg-doped) $(Al_{0.7}Ga_{0.3})_{0.5}In_{0.5}P$ cladding layer 5 (with a thickness of 400 nm and a carrier concentration of $1.2 \times 10^{18}/cm^3$), the p-type (Mg-doped) $(Al_{0.85}Ga_{0.15})As$ buffer layer 6 (with a thickness of 5 μm and a carrier concentration of $2 \times 10^{18}/cm^3$), and the p-type (Zn-doped) $Al_{0.1}Ga_{0.9}As$ contact layer 7 (with a thickness of 3 nm and a carrier concentration of $7.5 \times 10^{19}/cm^3$) are sequentially grown in lamination.

The growth temperature in the MOVPE growth is set at 650° C. from the n-type GaAs buffer layer 2 to the p-type buffer layer 6, and the growth temperature of the p-type contact layer 7 is set at 550° C. The other growth conditions are a growth pressure of about 6666 Pa (50 Torr), a growth rate of the respective layers in the range of 0.3 to 1.1 nm/sec, and a V/III ratio of about 150. However, the p-type contact layer 7 has a V/III ratio of 10. The p-type buffer layer 6 is made of AlGaAs with an Al composition of about 0.8 to 0.9 and the V/III ratio during the growth (in this case, about 50 in V/III ratio) is set such that the C (carbon) concentration of the p-type buffer layer 6 is about $1 \times 10^{18}/cm^3$. Herein, the V/III ratio is a ratio (quotient) obtained by a denominator, which is the number of moles of a group III material such as TMGa or TMAl, and a numerator, which is the number of moles of a group V material such as $AsH_3$ or $PH_3$.

A material used in the MOVPE growth can be an organic metal such as trimethyl gallium (TMGa) or triethyl gallium (TEGa) for Ga source, trimethyl aluminum (TMAl) for Al source and trimethyl indium (TMIn) for In source, or a hydride gas such as arsine ($AsH_3$) for As source and phosphine ($PH_3$) for P source. A dopant material for an n-type layer such as the n-type buffer layer 2 can be disilane ($Si_2H_6$). A dopant material for a conductivity-determining impurity of a p-type layer such as the p-type clad layer 5 and the p-type buffer layer 6 can be biscyclopentadienyl magnesium ($Cp_2Mg$). However, diethyl zinc (DEZn) is used only for the p-type contact layer 7.

Furthermore, a dopant material for a conductivity-determining impurity of an n-type layer can be also hydrogen selenide ($H_2Se$), monosilane ($SiH_4$), diethyl tellurium (DETe) and dimethyl tellurium (DMTe). A Zn source can be also dimethyl zinc (DMZn).

Then, after the LED epitaxial wafer is taken out from the MOVPE furnace, the ITO film 8 with a thickness of about 290 nm is formed by the vacuum deposition method on the surface of the wafer, i.e., the upper surface side of the p-type contact layer 7. In this structure, the ITO film 8 composes the current spreading layer.

At this time, an evaluating glass substrate set in the same batch as for the deposition of the ITO film 8 is taken out and cut into a size enough for the Hall measurement, and the electric characteristics of only the ITO film 8 are evaluated.

As a result, a carrier concentration is $1.05\times10^{21}/cm^3$, a mobility is 20.3 $cm^2/Vs$, and a resistivity is $2.94\times10^{-4}$ Ω·cm.

Then, the surface electrode 9 as a circular electrode and with a diameter of about 110 μm is provided in the form of a dot matrix on the upper surface of the epitaxial wafer by the vacuum deposition method by using tools or materials and process used for a general photolithography process such as a resist and a mask aligner. A liftoff method is used in electrode formation after the deposition. The surface electrode 9 is formed by sequentially depositing Ni (nickel) and Au (gold) with thicknesses of 20 nm and 500 nm, respectively. Furthermore, on the entire bottom surface of the epitaxial wafer, the back surface electrode 10 is formed by the same vacuum deposition method. The back surface electrode 10 is formed by sequentially depositing AuGe (gold-germanium alloy, germanium content of 7.4%), Ni (nickel), and Au (gold) with thicknesses of 60 nm, 10 nm, and 500 nm, respectively. Then, an alloy process to alloy the electrode is performed such that the electrode is heated at 440° C. in a nitrogen gas atmosphere for 5 minutes.

Then, the LED epitaxial wafer with the electrode formed as described above is cut by a dicer such that the circular surface electrode 9 is located at the center, so as to obtain an LED bear chip with a chip size of 300 μm square. Then, the LED bear chip is mounted (die-bonding) through an Ag paste on a TO-18 stem. Then, the LED bear chip is wire-bonded to have the LED device.

Initial characteristics of the LED device thus fabricated are evaluated. As a result, the LED device has excellent initial characteristics, i.e., an optical output of 0.99 mW and an operating voltage of 1.842 V during the power feeding at 20 mA (in evaluation).

Furthermore, a continuous current test for 168 hours (=1 week) is conducted where the LED device is driven at 50 mA in the environment of room temperature (about 23° C.) and atmospheric humidity (about 40%). As relative values as compared to those before the test, optical output is 102.1% (provided that optical output before the power feeding is 100%; hereinafter referred to as a relative output), and operation voltage is 1.843 V (about 0.1% increased).

SIMS analysis is conducted for the LED device just after the formation of the LED device and for the LED device after the continuous current test under the above conditions.

FIG. 12 is a diagram showing the result of SIMS analysis after the continuous current test. Meanwhile, the LED device sample as used in FIG. 12 is prepared such that its surface is removed several micrometers by mechanical polishing so as to enhance the measurement resolution of the SIMS analysis.

As the result of the SIMS analysis, it is confirmed that the C (carbon) concentration of the AlGaAs buffer layer 6 is about $1.0\times10^{18}/cm^3$ both before and after the continuous current test, and that, in the LED device of Example 5 after the continuous current test, Zn is not diffused into the active layer 4.

Figure 13B:
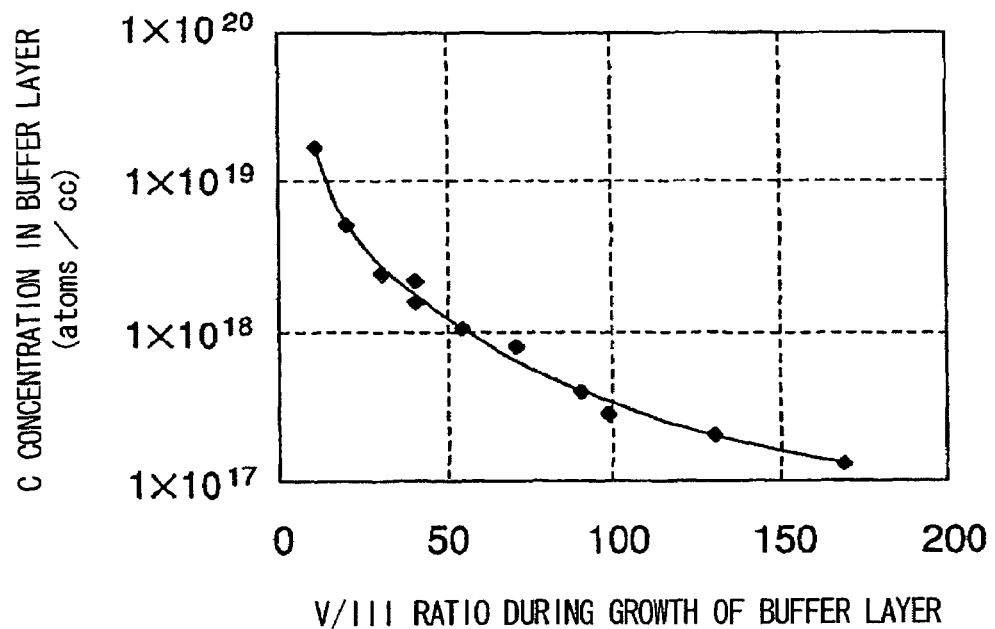
FIG. 13B is a graph showing a relationship between a V/III ratio during the growth of a buffer layer and a C concentration in the buffer layer.

In consideration of the above results, the C concentration of the buffer layer 6 is measured by the SIMS analysis while varying the V/III ratio during the formation of the AlGaAs buffer layer 6. FIG. 13B shows the measurement result. As shown in FIG. 13B, it is confirmed that the C concentration of the buffer layer 6 well correlates with the V/III ratio during the formation of the AlGaAs buffer layer 6. However, the C concentration of the buffer layer 6 is not determined simply by the V/III ratio, and it also depends on the growth temperature or the Al composition of the buffer layer 6. Thus, the control of the C concentration is not limited only to the V/III ratio.

Further, using sample's fabricated varying the V/III ratio as shown in FIG. 13B, the diffusion length of Zn doped in the contact layer 7 in the LED structure as described in Example 5 is measured. The relationship between the C concentration of the AlGaAs buffer layer and the Zn diffusion length is shown in FIG. 2B. FIG. 2B shows that the Zn diffusion length depends on the C concentration of the AlGaAs buffer layer. This result is represented by the expression: $L=6.872\times10^{-14}\times N_C^{0.733}$, where $N_C$ is a C (carbon) concentration [$cm^{-3}$] of the buffer layer 6 and L is a diffusion length [μm] of a dopant doped in the p-type contact layer 7. When the AlGaAs buffer layer 6 has a thickness of more than the diffusion length L obtained by the expression, Zn doped in the contact layer 7 is not diffused into the active layer 4 so that the LED device can be excellent both in initial property and reliability. Thus, the excellent properties of the LED device in Example 5 are based on the above reasons. Further, almost all of the LED devices in Example 5 can be fabricated without being broken.

Example 6

In Example 6, a red LED epitaxial wafer with a structure as shown in FIG. 3 and an emission wavelength of about 630 nm is fabricated. Its epitaxial growth method, epitaxial layer thickness, epitaxial layer structure, electrode formation method, and LED device fabrication method are basically the same as those in Example 5 (FIG. 1). Different points from Example 5 will be described below.

Example 6 has the feature that a device structure is employed that a semiconductor layer not positively doped, so-called undoped layer, is formed as the diffusion suppressing layer 11 between the active layer 4 and the p-type cladding layer 5. The diffusion suppressing layer 11 serves to prevent the p-type dopant doped into the upper p-type semiconductor layer including the p-type cladding layer 5 from penetrating into the active layer 4. The layer 11 has the same composition as the p-type cladding layer 5, and a thickness of 100 nm.

In addition, as a reference example for Example 6, an LED epitaxial wafer is fabricated such that the diffusion suppressing layer 11 is similarly inserted into an LED device as described later in Comparative Example 3 (FIG. 9).

Then, the LED epitaxial wafers thus fabricated are formed into devices as in Example 5.

Initial characteristics of the LED device thus fabricated are evaluated. As a result, the LED device in the reference example has excellent initial characteristics, i.e., an optical output of 0.96 mW and an operating voltage of 1.854 V during the power feeding at 20 mA (in evaluation).

Further, the continuous current test is conducted on the same conditions as Example 5. As a result, the LED device in the reference example has a relative output of 76.1% and an operating voltage of 1.904 V (about 2.6% increased), where the relative output is enhanced as compared to Comparative Example 3 described later.

Then, initial characteristics of the LED device in Example 6, i.e., the LED device with the diffusion suppressing layer 11 added to the LED structure in Example 5 as shown in FIG. 3, is evaluated. As a result, the LED device in Example 6 has excellent initial characteristics, i.e., an optical output of 0.97 mW and an operating voltage of 1.843 V during the power feeding at 20 mA (in evaluation).

Further, for the LED device in Example 6, the continuous current test is conducted on the same conditions as Example 5. As a result, the LED device has a relative output of 101.3% and an operating voltage of 1.843 V (no change).

As described above, although the diffusion suppressing layer 11 used in Example 6 does not completely suppress the diffusion of Zn, the diffusion suppressing layer 11 can serve to reduce the amount of Zn being diffused into the active layer 4. As a result, the LED device in the reference example can have the relative output enhanced as compared to Comparative Example 3 described later. Thus, even when the invention is applied to a device structure not subjected to the diffusion of Zn, the diffusion suppressing layer 11 can achieve the similar effect without causing any adverse effect.

Example 7

In Example 7, a red LED epitaxial wafer with a structure as shown in FIG. 4 and an emission wavelength of about 630 nm is fabricated. Its epitaxial growth method, epitaxial layer thickness, epitaxial layer structure, electrode formation method, and LED device fabrication method are basically the same as those in Example 5 (FIG. 1).

Example 7 has the feature that a light reflecting layer 12 is formed between the n-type GaAs buffer layer 2 and the n-type cladding layer 3 such that it comprises 20 pairs of DBR (distributed Bragg reflector) where an n-type AlInP layers and an n-type $Al_{0.4}Ga_{0.6}As$ layer, 20 layers respectively, are alternately formed.

The light reflecting layer 12 has a thickness obtained by $\lambda_p/(4 \times n)$ where $\lambda_p$ is an emission peak wavelength (nm) of the LED device and n is a refractive index of the semiconductor material to compose the light reflecting layer 12. The light reflecting layer 12 has uniformly a carrier concentration of about $1 \times 10^{18}/cm^3$.

Initial characteristics of the LED device thus fabricated are evaluated. As a result, the LED device in Example 7 has excellent initial characteristics, i.e., an optical output of 1.53 mW and an operating voltage of 1.855 V during the power feeding at 20 mA (in evaluation). Further, as the result of the continuous current test, the LED device in Example 7 has a relative output of 101.6% and an operating voltage of 1.856 V (about 0.1% increased).

As described above, in addition to the effects of Example 5, the LED device in Example 7 can have an optical output higher than that of Example 5 by providing the light reflecting layer 12 of semiconductor multilayer between the n-type buffer layer 2 and the n-type cladding layer 3. This effect is produced by the effective light extraction efficiency enhanced by the light reflecting layer 12.

Example 8

In Example 8, a red LED epitaxial wafer with a structure as shown in FIG. 5 and an emission wavelength of about 630 nm is fabricated. Its epitaxial growth method, epitaxial layer thickness, epitaxial layer structure, electrode formation method, and LED device fabrication method are basically the same as those in Example 5 (FIG. 1).

Example 8 has the feature that a MQW (multiquantum well) active layer 13 is used instead of the active layer 4. The MQW is composed of 40.5 pairs of a $(Al_{0.5}Ga_{0.5})_{0.5}In_{0.5}P$ (about 7.5 nm thick) barrier layer and a $Ga_{0.5}In_{0.5}P$ (about 5.5 nm thick) well layer.

A modification of Example 8 is an LED (not shown) that the composition ratio of Ga and In in the well layer of the MQW active layer 13 is changed to have a strained multi-quantum well structure so that a compressive or tensile stress is applied to a start GaAs substrate. The well layer with the strained multiquantum well structure in the modification is composed such that the Ga composition is reduced and the In composition is increased by that difference, and it is subjected to a compressive strain caused by a lattice mismatch that the lattice constant of the well layer is different from an underlying layer such as the n-type cladding layer 3.

The two LED devices (Example 8 and the modification) thus fabricated respectively have excellent initial characteristics, i.e., optical outputs of 1.14 and 1.23 mW and operating voltages of 1.844 and 1.843 V during power feeding at 20 mA (in evaluation).

Further, when the continuous current test is conducted under the same conditions as Example 5, the two LED devices have relative outputs of 102.5% and 102.3%, respectively.

As described above, in Example 8 and the modification each employing the MQW and strained multiquantum well structure instead of the active layer 4 of Example 5, each optical output is increased as compared to Example 5. Thus, by employing the quantum well structure, the internal quantum efficiency of the LED device can be increased to enhance the total characteristics of the LED device. Further, the features of Example 5 can be applied to the quantum well structure of Example 8 and the modification.

In Examples 5-8 of the invention, the red LED device with an emission wavelength of 630 nm is fabricated. However, other LED devices made of the same AlGaInP-based material with an emission wavelength of 560 to 660 nm can also have the effects of the invention by setting suitably the C (carbon) concentration and the thickness of the buffer layer.

In Examples 5-8 of the invention, the LED device structure is employed that the buffer layer 2 is formed between the GaAs substrate 1 and the n-type cladding layer 3. However, even when the n-type cladding layer 3 is formed directly on the GaAs substrate 1, the effects of the invention can be obtained.

Although Examples 5-8 have the circular surface electrode 9, the other electrode shape such as rectangular, rhombic and polygonal, and further the electrode shape being accompanied with a wing-shaped or branch-shaped portion can be used. Electrodes with such a shape can also have the effects of the invention.

In Examples 5-8, the semiconductor substrate comprises GaAs. Alternatively, an LED epitaxial wafer may comprise a Ge substrate, or GaAs or Ge substrate as a start substrate and then replaced by Si or a metallic self-standing substrate with a higher thermal conductivity than Si. Thereby, the effects of the invention can be obtained.

In Examples 5-8, the buffer layer 6 comprises AlGaAs which has an Al composition in the range of about 0.8 to 0.9. However, the invention is not limited to the Al composition. Even when the Al composition of the AlGaAs buffer layer 6 is not in the above range, or even when the V/III ratio is not in the range of Examples 5-8, there is no problem if only the C (carbon) concentration and the thickness of the buffer layer 6 are suitably set according to the invention.

For example, in case of an LED device with an emission wavelength of about 650 nm, even when the Al composition of the AlGaAs buffer layer 6 is in the range of about 0.6 to 0.7, light emitted from the active layer is little absorbed so that the LED device can have a high optical output. In addition, since the C concentration of the buffer layer 6 decreases directly in connection with the reduction in Al composition, the V/III ratio can be set lower than Examples 5-8 using the buffer layer 6 with an Al composition of 0.8 to 0.9.

In case of an LED device with an emission wavelength of about 570 nm, in order to eliminate the optical absorption to be caused by the buffer layer 6, the Al composition of the buffer layer 6 can be set to be around 0.9 so that the V/III ratio can be higher than the conventional one. Thus, even when the fabrication parameters such as a composition of material composing the buffer layer, a V/III ratio during the epitaxial growth or a growth temperature are changed, the effects of the invention can be obtained by satisfying the requirements of the invention.

In Examples 5-8, the current-spreading layer 8 comprises ITO. Instead of the ITO, a typical transparent conductive film such as ZnO and CTO film with a high transmittance for visible light and a low electrical resistivity can be used as the current-spreading layer 8. However, a more important factor for a material used as the current-spreading layer than the above two factors is enhancement in carrier concentration. Since the importance of the carrier concentration is as described above, materials applicable to the current-spreading layer will be limited to some extent in consideration of a reduction in the operating voltage of the LED device. Thus, a suitable material should be selected from the materials.

Comparative Example 3

In Comparative Example 3, a red LED epitaxial wafer with a structure as shown in FIG. 9 and an emission wavelength of about 630 nm is fabricated. Its epitaxial growth method, epitaxial layer thickness, epitaxial layer structure, electrode formation method, and LED device fabrication method are basically the same as those in Example 5 (FIG. 1). Different points from Example 5 will be described below.

Comparative Example 3 is prepared such that the V/III ratio during the growth of a p-type buffer layer 16 is 10 and the C concentration of the p-type buffer layer 16 is $1.8 \times 10^{19}/cm^3$.

Then, the LED epitaxial wafer thus fabricated is formed into devices as in Example 5.

Initial characteristics of the LED device thus fabricated are evaluated. As a result, the LED device in Comparative Example 3 has initial characteristics, i.e., an optical output of 0.92 mW and an operating voltage of 1.855 V during the power feeding at 20 mA (in evaluation).

Further, the continuous current test is conducted on the same conditions as Example 5. As a result, the LED device in Comparative Example 3 has a relative output of 52% and an operating voltage of 1.915 V (about 3% increased).

SIMS analysis is conducted for the LED device just after the formation of the LED device and for the LED device after the continuous current test under the above conditions.

FIG. 11 is a diagram showing the result of SIMS analysis after the continuous current test. Meanwhile, the LED device sample as used in FIG. 11 is prepared such that its surface is removed several micrometers by mechanical polishing so as to enhance the measurement resolution of the SIMS analysis.

As the result of the SIMS analysis, it is confirmed that the C (carbon) concentration of the buffer layer 16 is $1.8 \times 10^{19}/cm^3$ both before and after the continuous current test, and that, in the LED device of Comparative Example 3 after the continuous current test, Zn doped as a dopant into the p-type contact layer 7 is diffused into the active layer 4. Thus, deterioration in lifetime, i.e., reliability in the LED device of Comparative Example 3 is caused by the dopant diffusion.

Comparative Example 4

In Comparative Example 4, a red LED epitaxial wafer with a structure as shown in FIG. 10 and an emission wavelength of about 630 nm is fabricated. Its epitaxial growth method, epitaxial layer thickness, epitaxial layer structure, electrode formation method, and LED device fabrication method are basically the same as those in Comparative Example 3 (FIG. 9) Different points from Comparative Example 3 will be described below.

Comparative Example 4 is not formed with the p-type buffer layer 16. The p-type cladding layer 5 has a thickness of about 400 nm, which is enough to have a carrier confining effect and to serve as a carrier (hole) supply layer. Namely, the p-type cladding layer 5 with a thickness of about 400 nm can sufficiently serve as a cladding layer. Thus, the LED device of Comparative example 4 has the same structure as Comparative Example 3 except not having the AlGaAs buffer layer 16.

Then, the LED epitaxial wafer thus fabricated is formed into devices as in Comparative Example 3.

Initial characteristics of the LED device thus fabricated are evaluated. As a result, the LED device in Comparative Example 4 has initial characteristics, i.e., an optical output of 0.89 mW and an operating voltage of 1.840 V during the power feeding at 20 mA (in evaluation).

However, in evaluating the initial characteristics, about 20-30% of the devices are broken so that it does not emit light. Although the device not broken has the abovementioned characteristics, the about 20-30% of the devices broken cannot be evaluated. This is assumed because the device is broken in the wire bonding process before the device evaluation. When the continuous current test is conducted for the devices not broken under the same conditions as Comparative Example 3, the LED device has a relative output of 79% and an operating voltage of 1.850 V (about 0.5% increased).

As described above, in case of the structure without the buffer layer, the product yield deteriorates and the optical output and reliability is not sufficient. Namely, although the relative output is a little improved as compared to Comparative Example 3, the product yield is contrary reduced (In Comparative Example 3, none of the LED devices is broken).

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting device, comprising:
    a light-emitting portion formed on a semiconductor substrate, the light-emitting portion comprising an n-type cladding layer, an active layer and a p-type cladding layer;
    an As-based p-type contact layer formed on the light-emitting portion, the p-type contact layer being doped with a dopant at a concentration of $1 \times 10^{19}/cm^3$ or more and the dopant material doped into the p-type contact layer is different from one doped into the p-type cladding layer;
    a current spreading layer formed on the p-type contact layer, the current spreading layer comprising a metal oxide material; and
    a buffer layer formed between the p-type cladding layer and the p-type contact layer, wherein the buffer layer comprises a group III/V semiconductor with a p-type conductivity and hydrogen included intentionally or unavoidably therein, and the buffer layer comprises a thickness equal to or greater than a diffusion length L of a dopant doped into the p-type contact layer.

2. The semiconductor light emitting device according to claim 1, wherein:

the p-type cladding layer contains Mg as the dopant, the p-type contact layer contains Zn as the dopant, and the diffusion length L is represented by: L [μm]=6.869× $10^{-15} \times N_H^{0.788}$, where $N_H$ is a hydrogen concentration [cm$^{-3}$] of the buffer layer.

3. The semiconductor light emitting device according to claim 1, wherein:

the p-type contact layer comprises $Al_xGa_{1-x}As$, where $0 \leq x \leq 0.4$.

4. The semiconductor light emitting device according to claim 1, wherein:

the buffer layer comprises $Al_xGa_{1-x}As$, where $0.4 \leq x \leq 1$.

5. The semiconductor light emitting device according to claim 1, wherein:

the current-spreading layer comprises at least one of ITO (indium tin oxide), SnO$_2$ (tin oxide), ATO (antimony tin oxide), In$_2$O$_3$ (indium oxide), ZnO (zinc oxide), GZO (gallium zinc oxide), BZO (boron zinc oxide), AZO (aluminum zinc oxide), CdO (cadmium oxide), CTO (cadmium tin oxide), IZO (indium zinc oxide).

6. The semiconductor light emitting device according to claim 1, wherein:

the current-spreading layer comprises a thickness of within ±30% of d calculated by: d=A×$\lambda_p$/(4×n), where A is a constant (A=1 or 3), $\lambda_p$ is an emission wavelength (nm) of the light emitting device, and n is a refractive index of the current-spreading layer.

7. The semiconductor light emitting device according to claim 1, wherein:

the light-emitting portion comprises $(Al_xGa_{1-x})_yIn_{1-y}P$, where $0 \leq x \leq 1$ and $0.4 \leq y \leq 0.6$, and the p-type cladding layer and the n-type cladding layer comprise a higher Al composition than the active layer.

8. The semiconductor light emitting device according to claim 1, wherein:

the current-spreading layer comprises a carrier concentration of $7 \times 10^{20}$/cm$^3$ or more.

9. The semiconductor light emitting device according to claim 1, wherein:

the p-type contact layer comprises a thickness of 1 nm or more and 30 nm or less.

10. The semiconductor light emitting device according to claim 1, further comprising:

a light reflecting layer formed between the substrate and the n-type cladding layer, wherein the light reflecting layer comprises 10 pairs or more and 30 pairs or less of semiconductor layers, each pair comprising a combination of a high-refractive index material layer and a low-refractive index material layer.

11. The semiconductor light emitting device according to claim 10, wherein:

the light reflecting layer comprises at least one of $(Al_xGa_{1-x})As$ where $0.4 \leq x \leq 1$, and $(Al_xGa_{1-x})_yIn_{1-y}P$ where $0 \leq x \leq 1$ and $0.4 \leq y \leq 0.6$.

12. The semiconductor light emitting device according to claim 1, wherein:

the active layer comprises a light emitting layer and a barrier layer with a bandgap wider than the light emitting layer.

13. The semiconductor light emitting device according to claim 12, wherein:

the active layer comprises a quantum well structure that the light emitting layer comprises a thickness of 9 nm or less, or a strained quantum well structure that the light emitting layer comprises a crystal lattice constant different from that of the n-type cladding layer or the p-type cladding layer.

14. The semiconductor light emitting device according to claim 1, wherein:

the p-type cladding layer comprises at least a portion with a Mg concentration of $1 \times 10^{17}$/cm$^3$ or more and $5 \times 10^{18}$/cm$^3$ or less.

15. The semiconductor light emitting device according to claim 1, wherein:

the substrate comprises a semiconductor material of GaAs, Ge or Si, or a metallic material with a thermal conductivity greater than Si.

16. The semiconductor light emitting device according to claim 1, further comprising:

a diffusion-suppressing layer formed between the active layer and the p-type cladding layer, wherein the diffusion-suppressing layer comprises any one or a combination of: an undoped semiconductor layer, a semiconductor layer with a lower dopant concentration than the p-type cladding layer, and a semiconductor layer doped with an n-type dopant and a p-type dopant together to be neutral in pseudo conduction type, and the diffusion-suppressing layer comprises a thickness of 300 nm or less.

17. The semiconductor light emitting device according to claim 1, further comprising:

a diffusion-suppressing layer formed between the active layer and the n-type cladding layer, wherein the diffusion-suppressing layer comprises any one or a combination of: an undoped semiconductor layer, a semiconductor layer with a lower dopant concentration than the n-type cladding layer, and a semiconductor layer doped with an n-type dopant and a p-type dopant together to be neutral in pseudo conduction type, and the diffusion-suppressing layer comprises a thickness of 200 nm or less.

18. A semiconductor light emitting device, comprising:

a light-emitting portion formed on a semiconductor substrate, the light-emitting portion comprising an n-type cladding layer, an active layer and a p-type cladding layer;

an As-based p-type contact layer formed on the light-emitting portion, the p-type contact layer being doped with a dopant at a concentration of $1 \times 10^{19}$/cm$^3$ or more and the dopant doped into the contact layer being different from that doped into the p-type cladding layer;

a current spreading layer formed on the p-type contact layer, the current spreading layer comprising a metal oxide material; and a buffer layer formed between the p-type cladding layer and the p-type contact layer, wherein the buffer layer comprises a group III/V semiconductor with a p-type conductivity and carbon included intentionally or unavoidably therein, and the buffer layer comprises a thickness equal to or greater than a diffusion length L of a dopant doped into the p-type contact layer.

19. The semiconductor light emitting device according to claim 18, wherein:
the p-type cladding layer comprises Mg as the dopant,
the p-type contact layer comprises Zn as the dopant, and
the diffusion length L is represented by: L [μm]=$6.872 \times 10^{-14} \times N_C^{0.733}$, where $N_C$ is a carbon concentration [$cm^{-3}$] of the buffer layer.

20. The semiconductor light emitting device according to claim 18, wherein:
the p-type contact layer comprises $Al_xGa_{1-x}As$, where $0 \leq x \leq 0.4$.

21. The semiconductor light emitting device according to claim 18, wherein:
the buffer layer comprises $Al_xGa_{1-x}As$, where $0.4 \leq x \leq 1$.

22. The semiconductor light emitting device according to claim 18, wherein:
the current-spreading layer comprises at least one of ITO (indium tin oxide), $SnO_2$ (tin oxide), ATO (antimony tin oxide), $In_2O_3$ (indium oxide), ZnO (zinc oxide), GZO (gallium zinc oxide), BZO (boron zinc oxide), AZO (aluminum zinc oxide), CdO (cadmium oxide), CTO (cadmium tin oxide), IZO (indium zinc oxide).

23. The semiconductor light emitting device according to claim 18, wherein:
the current-spreading layer comprises a thickness of within ±30% of d calculated by: d=$A \times \lambda_p/(4 \times n)$, where A is a constant (A=1 or 3), $\lambda_p$ is an emission wavelength (nm) of the light emitting device, and n is a refractive index of the current-spreading layer.

24. The semiconductor light emitting device according to claim 18, wherein:
the light-emitting portion comprises $(Al_xGa_{1-x})_yIn_{1-y}P$, where $0 \leq x \leq 1$ and $0.4 \leq y \leq 0.6$, and
the p-type cladding layer and the n-type cladding layer comprise a higher Al composition than the active layer.

25. The semiconductor light emitting device according to claim 18, wherein:
the current-spreading layer comprises a carrier concentration of $7 \times 10^{20}/cm^3$ or more.

26. The semiconductor light emitting device according to claim 18, wherein:
the p-type contact layer comprises a thickness of 1 nm or more and 30 nm or less.

27. The semiconductor light emitting device according to claim 18, further comprising:
a light reflecting layer formed between the substrate and the n-type cladding layer,
wherein the light reflecting layer comprises 10 pairs or more and 30 pairs or less of semiconductor layers, each pair comprising a combination of a high-refractive index material layer and a low-refractive index material layer.

28. The semiconductor light emitting device according to claim 27, wherein:
the light reflecting layer comprises at least one of $(Al_xGa_{1-x})As$ where $0.4 \leq x \leq 1$, and $(Al_xGa_{1-x})_yIn_{1-y}P$ where $0 \leq x \leq 1$ and $0.4 \leq y \leq 0.6$.

29. The semiconductor light emitting device according to claim 18, wherein:
the active layer comprises a light emitting layer and a barrier layer with a bandgap wider than the light emitting layer.

30. The semiconductor light emitting device according to claim 29, wherein:
the active layer comprises a quantum well structure that the light emitting layer comprises a thickness of 9 nm or less, or a strained quantum well structure that the light emitting layer comprises a crystal lattice constant different from that of the n-type cladding layer or the p-type cladding layer.

31. The semiconductor light emitting device according to claim 18, wherein:
the p-type cladding layer comprises at least a portion with a Mg concentration of $1 \times 10^{17}/cm^3$ or more and $5 \times 10^{18}/cm^3$ or less.

32. The semiconductor light emitting device according to claim 18, wherein:
the substrate comprises a semiconductor material of GaAs, Ge or Si, or a metallic material with a thermal conductivity greater than Si.

33. The semiconductor light emitting device according to claim 18, further comprising:
a diffusion-suppressing layer formed between the active layer and the p-type cladding layer,
wherein the diffusion-suppressing layer comprises any one or a combination of: an undoped semiconductor layer, a semiconductor layer with a lower dopant concentration than the p-type cladding layer, and a semiconductor layer doped with an n-type dopant and a p-type dopant together to be neutral in pseudo conduction type, and
the diffusion-suppressing layer comprises a thickness of 300 nm or less.

34. The semiconductor light emitting device according to claim 18, further comprising:
a diffusion-suppressing layer formed between the active layer and the n-type cladding layer,
wherein the diffusion-suppressing layer comprises any one or a combination of: an undoped semiconductor layer, a semiconductor layer with a lower dopant concentration than the n-type cladding layer, and a semiconductor layer doped with an n-type dopant and a p-type dopant together to be neutral in pseudo conduction type, and
the diffusion-suppressing layer comprises a thickness of 200 nm or less.

* * * * *